(12) United States Patent
Guo et al.

(10) Patent No.: US 12,430,487 B2
(45) Date of Patent: *Sep. 30, 2025

(54) SEMICONDUCTOR DEVICE INCLUDING STANDARD CELL HAVING SPLIT PORTIONS

(71) Applicant: TAIWAN SEMICONDUCTOR MANUFACTURING COMPANY LTD., Hsinchu (TW)

(72) Inventors: Ta-Pen Guo, Taipei (TW); Chien-Ying Chen, Chiayi County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/360,799

(22) Filed: Jul. 27, 2023

(65) Prior Publication Data

US 2023/0367948 A1 Nov. 16, 2023

Related U.S. Application Data

(63) Continuation of application No. 17/072,792, filed on Oct. 16, 2020, now Pat. No. 11,803,682.
(Continued)

(51) Int. Cl.
*G06F 30/30* (2020.01)
*G03F 1/70* (2012.01)
(Continued)

(52) U.S. Cl.
CPC ............. *G06F 30/392* (2020.01); *G03F 1/70* (2013.01); *G06F 30/398* (2020.01); *H01L 23/50* (2013.01); *H01L 24/20* (2013.01)

(58) Field of Classification Search
CPC ........ G06F 30/392; G06F 30/398; G03F 1/70; H01L 23/50; H01L 24/20;
(Continued)

(56) References Cited

U.S. PATENT DOCUMENTS 7,821,039 B2 10/2010 Tien et al.
10,910,313 B2 * 2/2021 Sengupta .............. H01L 23/485
(Continued)

FOREIGN PATENT DOCUMENTS

TW 201924058 A 6/2019
TW 201935652 A 9/2019

OTHER PUBLICATIONS

Office Action, Cited References and Search Report dated Feb. 17, 2024 issued by the Taiwan Intellectual Property Office for the Taiwan Counterpart Application No. 110101147.
(Continued)

*Primary Examiner* — Jack Chiang
*Assistant Examiner* — Brandon Bowers
(74) *Attorney, Agent, or Firm* — WPAT LAW; Anthony King

(57) ABSTRACT

A semiconductor device includes a first power rail configured to supply a first voltage, a second power rail configured to supply a second voltage different from the first voltage, and a first cell arranged in a first row between the first and second power rails. The first cell has a first first-type active region and a first second-type active region. The semiconductor device further includes a second cell having a second first-type active region and a second second-type active region, wherein the second first-type active region extends in a second row and a third row on a first side of the first row. The semiconductor device also includes a third cell includ-
(Continued)

ing a first portion and a second portion, wherein the first portion and the second portion are arranged on two sides of the first cell.

20 Claims, 13 Drawing Sheets

Related U.S. Application Data

(60) Provisional application No. 62/964,314, filed on Jan. 22, 2020.

(51) Int. Cl.
*G06F 30/392* (2020.01)
*G06F 30/398* (2020.01)
*H01L 23/00* (2006.01)
*H01L 23/50* (2006.01)

(58) Field of Classification Search
CPC ....... H01L 2027/11881; H01L 23/5286; H01L 27/0207; H01L 21/823821; H01L 21/823871; H01L 27/092; H01L 27/0924
See application file for complete search history.

(56) References Cited

U.S. PATENT DOCUMENTS

| | | | |
|---|---|---|---|
| 10,957,765 B2* | 3/2021 | Park | H10D 84/038 |
| 11,803,682 B2* | 10/2023 | Guo | H01L 23/50 |
| 2008/0023792 A1* | 1/2008 | Liu | G06F 30/392 |
| | | | 257/532 |
| 2019/0272868 A1 | 9/2019 | Guo et al. | |
| 2021/0074697 A1* | 3/2021 | Baek | H10D 84/85 |

OTHER PUBLICATIONS

U.S. Pat. No. 10,957,765 B2 is the US counterpart of TW 201924058.
U.S. Pat. No. 10,910,313 B2 is the US counterpart of TW 201935652.

* cited by examiner

SEMICONDUCTOR DEVICE INCLUDING STANDARD CELL HAVING SPLIT PORTIONS

PRIORITY CLAIM AND CROSS-REFERENCE

This application claims priority to U.S. Provisional Application No. 62/964,314 filed Jan. 22, 2020, is a continuation application of U.S. Non-Provisional application Ser. No. 17/072,792 filed Oct. 16, 2020, and is related to U.S. Non-Provisional application Ser. No. 17/818,208 filed Aug. 8, 2022, disclosures of which are hereby incorporated by reference in its entirety.

BACKGROUND

Electronic equipment involving semiconductor devices is essential for many modern applications. Technological advances in materials and design have produced generations of semiconductor devices, in which each generation includes smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductor devices. The manufacturing of a semiconductor device becomes more complicated in a miniaturized scale, and the increase in complexity of manufacturing may cause deficiencies such as high yield loss, reduced reliability of electrical interconnection and low testing coverage. Therefore, there is a continuous need to modify the structure and manufacturing method of the devices in electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
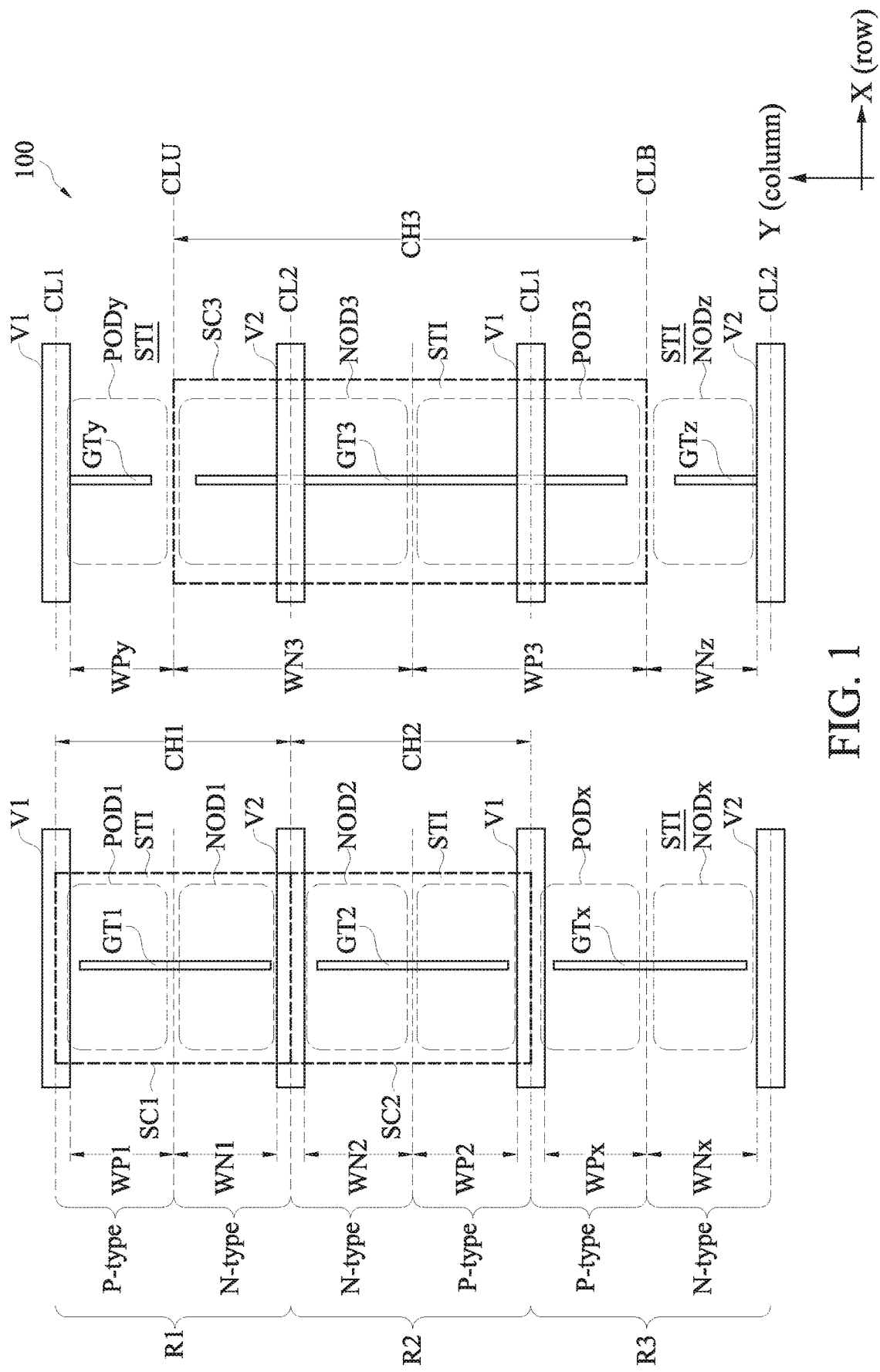
FIG. 1 is a schematic diagram of a design layout, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of various patterns in one or more layers and may be expressed as unions of polygons. A design layout may be initially constructed by an array of identical or different standard cells during the layout design stage. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor circuit manufacturers or designers.

FIG. 1 is a schematic diagram of a design layout 100, in accordance with some embodiments. The design layout 100 may be related to or part of a semiconductor device, e.g., a complementary metal-oxide-semiconductor (CMOS) device, and can be implemented using a planar field-effect transistor (FET) device, a fin-type FET (FinFET) device, a gate-all-around (GAA) device, a nanowire device, a fully-depleted silicon-on-isolator (FDSOI) device, or the like.

Referring to FIG. 1, the design layout 100 includes a plurality of standard cells, for example, standard cells SC1, SC2 and SC3. As shown in FIG. 1, the design layout 100 includes a first row R1, a second row R2 and a third row R3. The standard cell SC1 and the standard cell SC2 are arranged in rows R1 and R2, respectively, and the standard cell SC3 spans the rows R1, R2 and R3. Although FIG. 1 shows only two standard cells in one row, the number of standard cells arranged in one row may be greater than two. In some embodiments, the standard cell SC1 is flush with the standard cell SC2 in a column direction or in a direction along the y-axis (perpendicular to a row direction or a direction along the x-axis). However, the standard cells SC1 and SC2 may be offset from each other. In the depicted embodiment, the standard cell SC3 is separated from the standard cells SC1 and SC2. In some other embodiments, the standard cell SC3 abuts the standard cell SC1 or SC2. As explained below, multiple rows of the standard cells may be arranged so as to be stacked in a column direction in the design layout 100.

As shown in FIG. 1, an upper first power rail V1 and a lower first power rail V1 are arranged on an upper side of the standard cell SC1 and a lower side of the standard cell SC2, respectively, and face away from each other. The first power rails V1 are configured to supply a first voltage. The standard cells SC1 and SC2 further share an upper second power rail V2 for supplying a second voltage different from the first voltage. In some embodiments, the first voltage is set at VDD (a positive voltage) and the second voltage is set at VSS (e.g., ground). In some embodiments, the upper second power rail V2 is aligned with the side at which the standard cell SC1 abuts the standard cell SC2. In some embodiments, the side at which the standard cell SC1 abuts the standard cell SC2 is aligned with a center line CL2 of the upper second power rail V2. In some embodiments, the power rails V1 and V2 are formed by metal lines disposed in a metal line layer (e.g., layer M2 in FIG. 5) of the respective standard cells SC1 and SC2.

In some embodiments, a row height of the first row R1 is defined as a distance in the column direction between a center line CL1, extending in the row direction, of the upper first power rail V1 and the center line CL2, extending in the row direction, of the upper second power rail V2. In some embodiments, a cell height CH1 is determined based on a pitch between the upper first power rail V1 and the upper second power rail V2. Similarly, a row height of the upper second row R2 is defined as a distance in the column direction between a center line CL1, extending in the row direction, of the lower first power rail V1 and the center line CL2 of the upper second power rail V2. In some embodiments, the row height of the second row R2 is determined based on a pitch between the lower first power rail V1 and the upper second power rail V2. In some embodiments, the row height of the first row R1 is the same as or different from the row height of the upper second row R2.

In some embodiments, the cell height CH1 of the standard cell SC1 is determined based on the row height of the first row R1. In some embodiments, the cell height CH1 is determined based on a pitch between the upper first power rail V1 and the upper second power rail V2. In some embodiments, the cell height CH1 is equal to the row height of the first row R1 in which the standard cell SC1 resides.

Similarly, a cell height CH2 of the standard cell SC2 is determined based on the row height of the second row R2. In some embodiments, the cell height CH2 is determined based on a pitch between the lower first power rail V1 and the upper second power rail V2. In some embodiments, the cell height CH1 is the same as or different from the cell height CH2. In some embodiments, the cell height CH2 is equal to the row height of the second row R2 in which the standard cell SC2 resides.

As described above, the upper second power rail V2 is shared by the standard cell SC1 and the standard cell SC2. One of ordinary skill in the art should understand that the design layout 100 may include one or more standard cells arranged in one row immediately above the standard cell SC1 (or below the standard cell SC2) and sharing the upper first power rail V1 (or the lower first power rail V2) with the standard cell SC1 (or the standard cell SC2).

As described above, in some embodiments, the upper second power rail V2 is arranged between the upper and lower first power rails V1, wherein the upper second power rail V2 supplies the second voltage and the upper and lower first power rails V1 supply the first voltage. As such, the standard cells SC1 and SC2 are referred to herein as first-type standard cells, in which the cell height CH1 or CH2 is defined as a distance between the upper first power rail V1 (or the lower first power rail V1) that supplies the first voltage and the second power rail V2 that supplies a second voltage. In some embodiments, the first-type standard cell is not divided by any of the power rails V1 or V2.

In some embodiments, the standard cell SC1 or SC2 includes active regions, also referred to herein as oxide-definition ("OD") regions, such as a P-type active region POD1 or POD2 and an N-type region NOD1 or NOD2. The active region may be used to form source/drain regions and a channel region between the source/drain regions of a FET device. In some embodiments, the N-type active region NOD1 or NOD2 is a semiconductor intrinsic region (such as silicon) doped with N-type impurities, such as arsenic, phosphorus, or the like. In some embodiments, the P-type active region POD1 or POD2 is a semiconductor intrinsic region doped with P-type impurities, such as boron or the like. The active regions are laterally surrounded and defined by isolation structures, such as a shallow trench isolation structure STI. In some embodiments, the isolation structure STI is formed of dielectric materials, such as oxide, nitride, oxynitride, silicon dioxide, nitrogen-bearing oxide, nitrogen-doped oxide, silicon oxynitride, polymer, or the like.

In some embodiments, the P-type active region POD1 and the N-type active region NOD1 of the standard cell SC1 have substantially equal widths in the column direction, i.e., WP1=WN1. Similarly, the P-type active region POD2 and the N-type active region NOD2 of the standard cell SC2 have substantially equal widths in the column direction, i.e., WP2=WN2. In some embodiments, the widths WP1, WN1, WP2 or WN2 are each related to the cell height CH1 or CH2 of the respective standard cell SC1 or SC2.

In some embodiments, adjacent rows, e.g., the first row R1 and the second row R2, are arranged such that the two active regions NOD1 and NOD2, or POD2 and POD2, that have the same conductivity are disposed closer to each other than the active region having opposite conductivity. For example, the N-type active regions NOD1 and NOD2 of the standard cells SC1 and SC2, respectively, are disposed between the two P-type active regions POD1 and POD2 of the standard cells SC1 and SC2. In some embodiments, the N-type active regions NOD1 and NOD2 of the standard cells SC1 and SC2, respectively, are separated by the isolation structures STI of the respective standard cells SC1 and SC2.

The standard cell SC1 further includes a gate electrode GT1 extending in the column direction and disposed over the active regions POD1 and NOD1. Similarly, the standard cell SC2 further includes a gate electrode GT2 extending in the column direction and disposed over the active regions POD2 and NOD2. The active region POD1, POD2, NOD1 or NOD2 and the corresponding gate electrode GT1 or GT2 may be used together for defining a source region, a drain region and a channel region below the respective gate electrode of a FET device. In some embodiments, the gate electrodes GT1 and GT2 are aligned with each other along the column direction. In some embodiments, the gate electrodes GT1 and GT2 are separated. In some embodiments, the gate electrode GT1 or GT2 does not overlap the power rails V1 and V2. In the depicted embodiments, only one gate electrode GT1 or GT2 is formed in the standard cell SC1 or the standard cell SC2. However, other arrangements are also possible, e.g., multiple gate electrodes may be disposed parallel to a gate pitch along the row direction.

In some embodiments, the design layout 100 further includes a P-type active region PODx and an N-type active region NODx in the row R3. The P-type active region PODx and the N-type active region NODx have respective widths WPx and WNx in the column direction. In some embodiments, the design layout 100 includes a gate electrode GTx extending in the column direction and overlapping the active regions PODx and NODx. The active regions PODx and NODx may have configurations similar to those of the P-type active region POD1 and N-type active region NOD1, respectively, of the standard cell SC1. A gate electrode GTx is provided extending in the column direction and ovrelapping the P-type active region PODx and the N-type active region NODx. In some embodiments, the active regions PODx and NODx belong to another standard cell (not separately shown) or are left as non-functional regions.

The standard cell SC3 is arranged so as to span the rows R1, R2 and R3. In some embodiments, the standard cell SC3 extends in the column direction through the row R2 and occupies a portion of the row R1 and a portion of the row R3. In some embodiments, the standard cell SC3 includes an upper second power rail V2 and a lower first power rail V1 that are aligned with the corresponding upper second power rail V2 and the lower first power rail V1 of the standard cell SC1 or SC2 in the row direction. In some embodiments, the power rails V1 and V2 of the standard cell SC3 connect to the corresponding power rails V1 and V2 of the standard cells SC1 and SC2.

In some embodiments, the standard cell SC3 includes active regions for forming FET devices. For example, the standard cell SC3 includes an N-type active region NOD3 and a P-type active region POD3. In some embodiments, the N-type active region NOD3 is separated from the P-type active regions POD3 by the isolation structure STI. In some embodiments, the N-type active region NOD3 extends from the first row R1 to the second row R2 by "gluing" the standalone N-type active regions that are similar to the active regions NOD1 and NOD2 in the rows R1 and R2, and thus the N-type active region NOD3 intersects the upper second power rail V2. In some embodiments, the N-type active region NOD3 is symmetric with respect to the upper second power rail V2.

Similarly, the P-type active region POD3 extends from the second row R2 to the third row R3 by "gluing" the standalone P-type active regions that are similar to the active regions POD2 and PODx, and thus the P-type active region POD3 intersects the lower first power rail V1. In some embodiments, the P-type active region POD3 is symmetric with respect to the lower first power rail V1.

In some embodiments, the N-type active region NOD1 has an upper side substantially aligned with an upper side of the N-type active region NOD3, and the P-type active region POD2 has a lower side substantially aligned with a lower side of the P-type active region POD3.

As shown in FIG. 1, the N-type active region NOD3 has a width WN3 in the column direction greater than a width sum WN1+WN2 of the N-type active regions NOD1 and NOD2 in the column direction of FIG. 1. In some embodiments, the width WN3 is greater than twice the width WN1 or greater than twice the width WN2. In some embodiments, a distance between an upper side of the N-type active region NOD1 and a lower side of the N-type active region NOD2 in the column direction is substantially equal to the width WN3 of the N-type active region NOD3.

Likewise, the P-type active region POD3 has a width WP3 in the column direction greater than a width sum WP1+WPx of the P-type active regions POD2 and PODx. In some embodiments, the width WP3 is greater than twice the width WP2 or greater than twice the width WPx. In some embodiments, a distance between an upper side of the P-type active region POD2 and a lower side of the P-type active region PODx in the column direction is substantially equal to the width WP3 of the P-type active region POD3. In some embodiments, the width WN3 is substantially equal to the width WP3.

In some embodiments, the design layout 100 further includes a P-type active region PODy arranged in the row R1 and an N-type active region NODz arranged in the row R3. The P-type active region PODy and the N-type active region NODz have respective widths WPy and WNz in the column direction. In some embodiments, the design layout 100 includes a gate electrode GTy and a gate electrode GTz extending in the column direction and overlapping the active regions PODy and NODz, respectively. The active regions PODy and NODz may have configurations similar to those of the P-type active region POD1 and N-type active region NOD1, respectively, of the standard cell SC1. In some embodiments, the active regions PODy and NODz belong to another standard cell (not separately shown) or are left as non-functional regions.

In some embodiments, a cell height CH3 of the standard cell SC3 is determined based on a distance in the column direction between a center line CLU, extending in the row direction, of the row R1 and a center line CLB, extending in the row direction, of the row R3. In some embodiments, the center line CLU is a line extending between the P-type active region PODy and the N-type active region NOD3, and the center line CLB is a line extending between the N-type active region NODz and the P-type active region POD3. The standard cell SC3 is referred to herein as a second-type standard cell, in which one second power rail V2 and one first power rail V1 cross the N-type active region NOD3 and the P-type active region POD3, respectively. In some embodiments, the cell height CH3 is equal to a sum of the row height of the row R2, one half row height of the row R1 and one half row height of the row R3 in which the standard cell SC3 resides. In some embodiments, the standard cell SC3 only includes two or more glued P-type or N-type active regions and does not include any standalone P-type active region, e.g., POD1, or N-type active region, e.g., NOD1.

As described above, the standard cell SC1 or SC2 may include one or more gate electrodes GT1 or GT2 over the respective active regions, e.g., NOD1, POD1, NOD2 and POD2. As shown in FIG. 1, the standard cell SC3 includes a gate electrode GT3 extending in the column direction and overlapping the N-type active region NOD3 and the P-type active region POD3. In some embodiments, the gate electrode GT3 crosses the upper second power rail V2 and the lower first power rail V1.

In advanced generations of semiconductor manufacturing, the standard cells are first-type standard cells arranged uniformly across the design layout and their dimensions (at least in the column direction) are continually being reduced to facilitate design and manufacturing of ever-smaller semiconductor devices. However, the uniform and compact standard cells may not fulfill the various requirements of the semiconductor device, e.g., high-speed devices. One common method of increasing the device speed is to increase the area of the effective active region by joining the active regions of multiple standard cells through interconnection wiring. In contrast, through the introduction of the second-type standard cell, the width (area) of the enlarged active region of the second-type standard cell is greater than the width sum (area sum) of the individual active regions of the first-type standard cells by leveraging the space separating the adjacent active regions of abutting first-type standard cells. The enlarged or "glued" active region, e.g., the N-type active region NOD3 or the P-type active region POD3, may provide improved performance to the FET device implemented using the second-type standard cell as compared to the FET device implemented using the interconnected first-type standard cells. In addition, interconnection wirings that are used to otherwise connect the separated active regions of the first-type standard cells can be completely or partly reduced.

In the depicted embodiments, the second-type standard cell SC3 includes the glued N-type active region NOD3 over the glued P-type active region POD3 from a top-view perspective. In some other embodiments, another second-type standard cell includes a glued P-type active region over a glued N-type active region from a top-view perspective.

Figure 2:
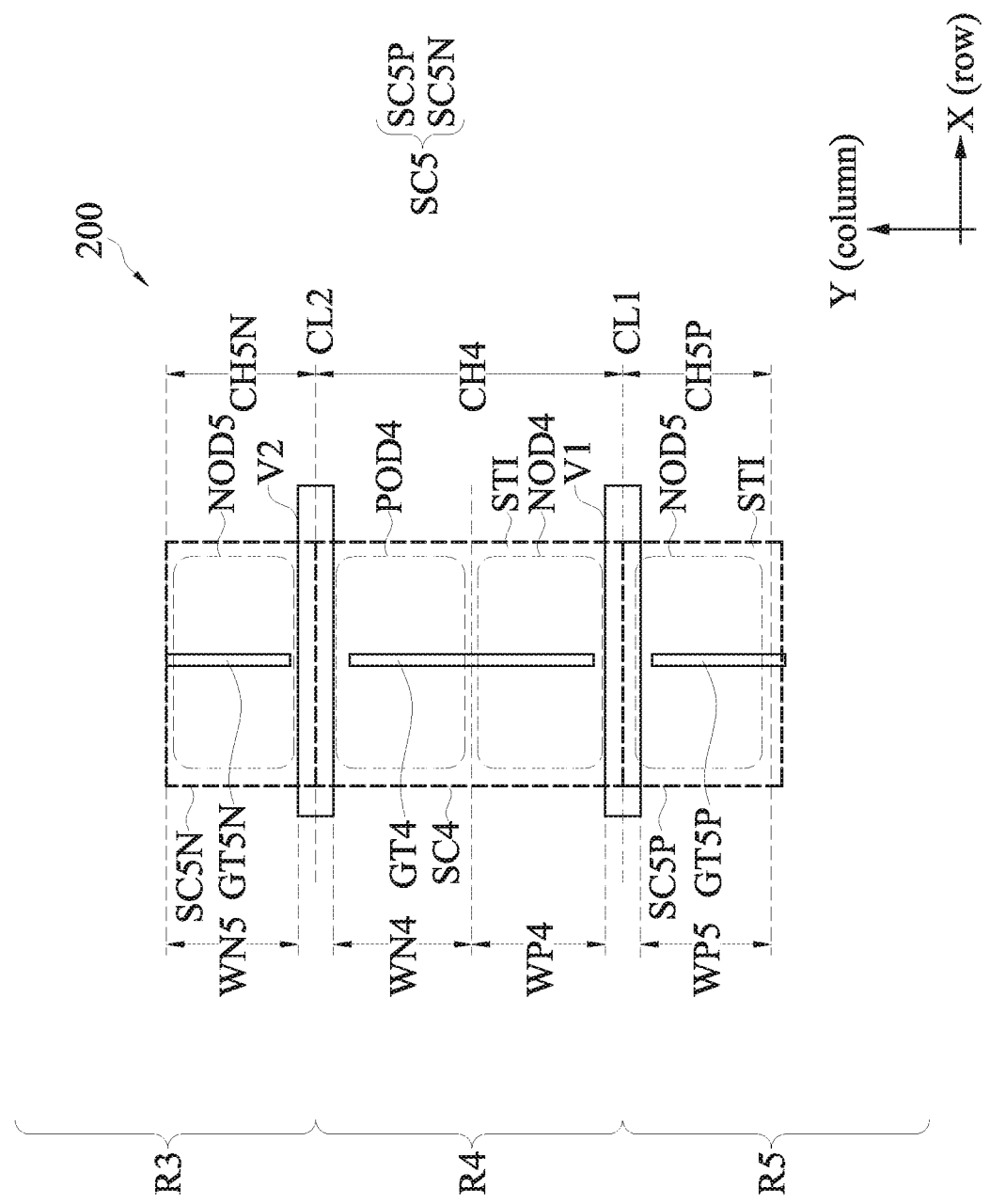
FIG. 2 is a schematic diagram of a design layout, in accordance with some embodiments of the present disclosure.

FIG. 2 is a schematic diagram of a design layout 200, in accordance with some embodiments. The design layout 200 may be related to or part of a semiconductor device, e.g., a CMOS device, and can be implemented using a planar FET device, a FinFET device, a GAA device, a nanowire device, an FDSOI device, or the like. In some embodiments, the design layout 200 is related to the design layout 100 and includes rows R3, R4 and R5 arranged in the column direction together with the rows R1 through R3 shown in FIG. 1.

Referring to FIG. 2, the design layout 200 includes standard cells SC4 and SC5. The standard cell SC4 is a first-type standard cell similar to the standard cells SC1 and SC2 and is arranged in the row R4. The standard cell SC4 has a cell height CH4 equal to a pitch of a second-type power rail V2 and a first-type power rail V1 on the lower side of the row R3 and the lower side of the row R4, respectively. The standard cell SC4 further includes an N-type active region NOD4 and a P-type active region POD4 having respective widths WN4 and WP4 in the column direction. The standard cell SC4 further includes a gate electrode GT4 extending in the column direction and overlapping the active regions NOD4 and POD4.

In some embodiments, the standard cell SC5 includes two portions SC5N and SC5P separate from each other. In some embodiment, the portions SC5N and SC5P are arranged in different rows of the design layout 200. In some embodiments, the portions SC5N and SC5P are separated by other features of the layout 200, such as the standard cell SC4. In some embodiments, the portions SC5N and SC5P include an N-type active region NOD5 and a P-type active region POD5, respectively. The N-type active region NOD5 and a P-type active region POD5 may be separated by another feature in the design layout 200, such as a P-type active region, an N-type active region, an isolation structure, a fin structure or the like. In some embodiments, the portions SC5N and SC5P are electrically coupled through interconnected metal lines disposed in other layers and configured to implement an electronic circuit and function as a single unit, in which the electronic circuit may include a NAND gate device, an inverter gate, an XOR gate, an AND gate, a NOR gate, an And-Or-Inverter (AOI) gate, or other suitable logic gate devices.

In some embodiments, the cell height CH5 of the standard cell SC5 is substantially equal to the cell height CH4 of the standard cell SC4. In some embodiments, a height of each of the portion SC5P and SC5N is substantially equal to one half of the cell height CH5. In some embodiments, a height summation CH5P+CH5N of the portion SC5P and the portion SC5N in the column direction is equal to the cell height CH5 or CH4.

As shown in FIG. 2, the standard cell SC5 includes gate electrodes GT5N and GT5P extending in the column direction and overlapping the N-type active region NOD5 and the P-type active region POD5, respectively. In some embodiments, the electrode gates GT5N and GT5P are aligned with and separated by the gate electrode GT4.

Referring to FIG. 1 and FIG. 2, in the depicted embodiments, the N-type active region NODz in FIG. 1 can be replaced with the N-type active region NOD5 so that the stack of standard cells SC4 and SC5 abuts the standard cell SC3 from below. Likewise, although not separately shown, the P-type active region PODy can be replaced with the P-type active region POD5 so that the stack of standard cells SC4 and SC5 abuts the standard cell SC3 from above. The standard cell SC5 that has split portions SCP5 and SCN5 or split active regions NOD5 and POD5 that are separated by the standard cell SC4 or other features of the design layout 200 is referred to herein as a third-type standard cell.

In some embodiments, as shown in FIG. 1 and FIG. 2, the first-type standard cells SC1, SC2 and SC4 have respective upper cell sides and lower cell sides aligned with the center lines of either the first power rails V1 or the second power rails V2, and therefore the first-type standard cells SC1, SC2 and SC4 are referred to as "on-grid" standard cells. In other words, the width of an on-grid standard cell in the column direction is defined as the width of an entire row or an aggregation of contiguous rows. The arrangement of the on-grid standard cells in the design layout 100 enables better placement efficiency of a cell placement operation.

Further, the second-type standard cell SC3 has an upper cell side and a lower cell side offset from any of the first power rails V1 or the second power rails V2, and therefore the second-type standard cell SC3 is referred to as an "off-grid" standard cell. The second-type standard cell SC3 enjoys the advantages of obtaining larger active regions (e.g., two glued active regions NOD3 and POD3) as compared to the standalone active regions in the on-grid first-type standard cells. The arrangement of the glued active regions facilitates design of a high-performance CMOS device, such as a high-speed device, with a reduced cell area.

The third-type standard cell SC5 is introduced to improve the area utilization of the design layout 100 under the mixed arrangements of the on-grid first-type standard cells and the off-grid second-type standard cells. The split portions SC5N and SC5P of the standard cell SC5 can fit into the unpaired portions (e.g., the portions occupied by the active regions PODy and NODz in FIG. 1) left due to allocation of the second-type standard cell SC3 such that the otherwise discarded active regions PODy and NODz can be reused for forming functional regions. The unused cell areas can be reduced effectively.

Figure 3:
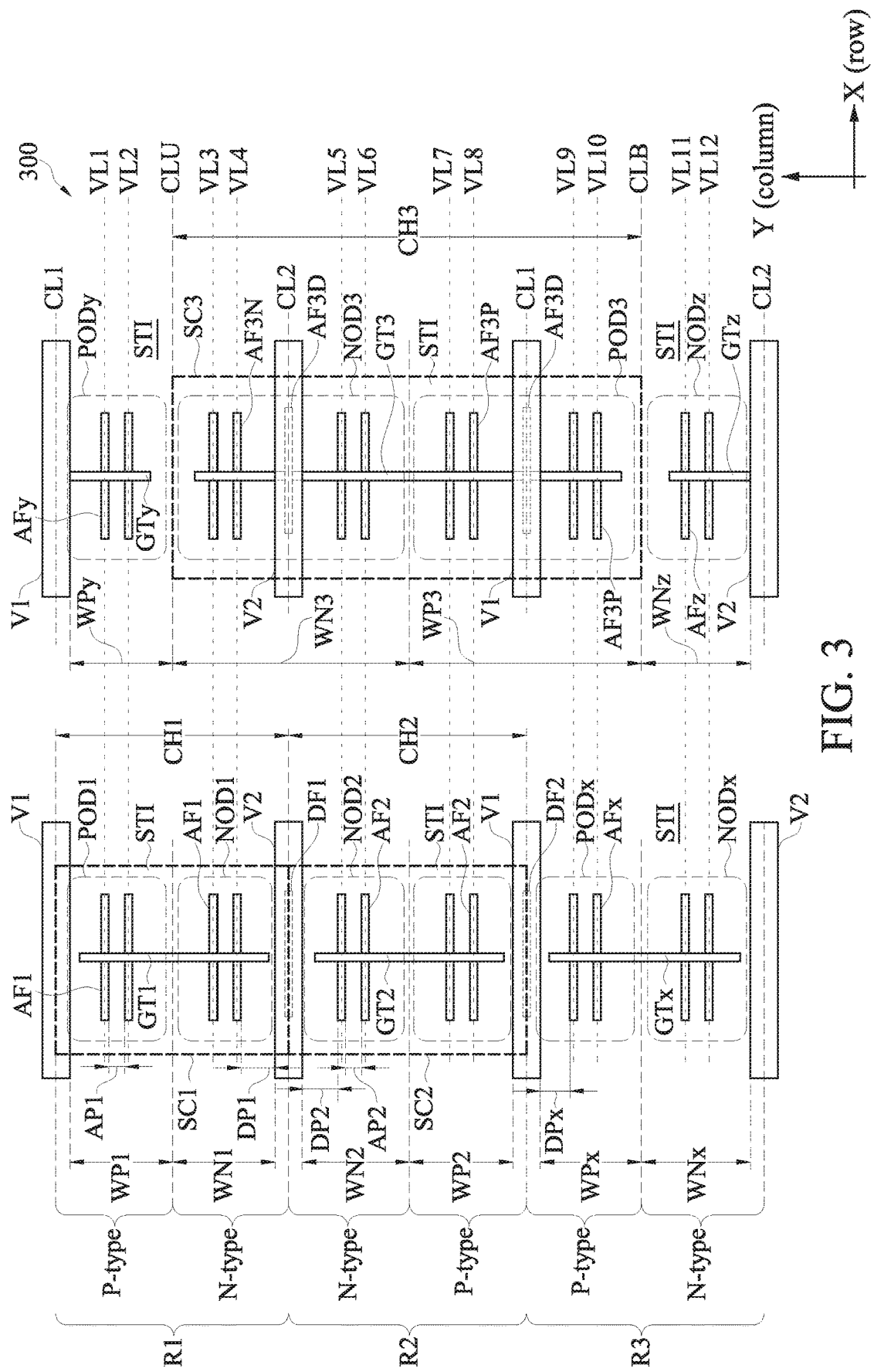
FIG. 3 is a schematic diagram of a design layout, in accordance with some embodiments of the present disclosure.

FIG. 3 is a schematic diagram of a design layout 300, in accordance with some embodiments. The design layout 300 is similar to the design layout 100 or 200 in many aspects, and the semiconductor device implemented by the design layout 300 is formed as FinFET devices in which the active regions in FIG. 3 are supplemented or replaced by fin structures.

Figure 4:
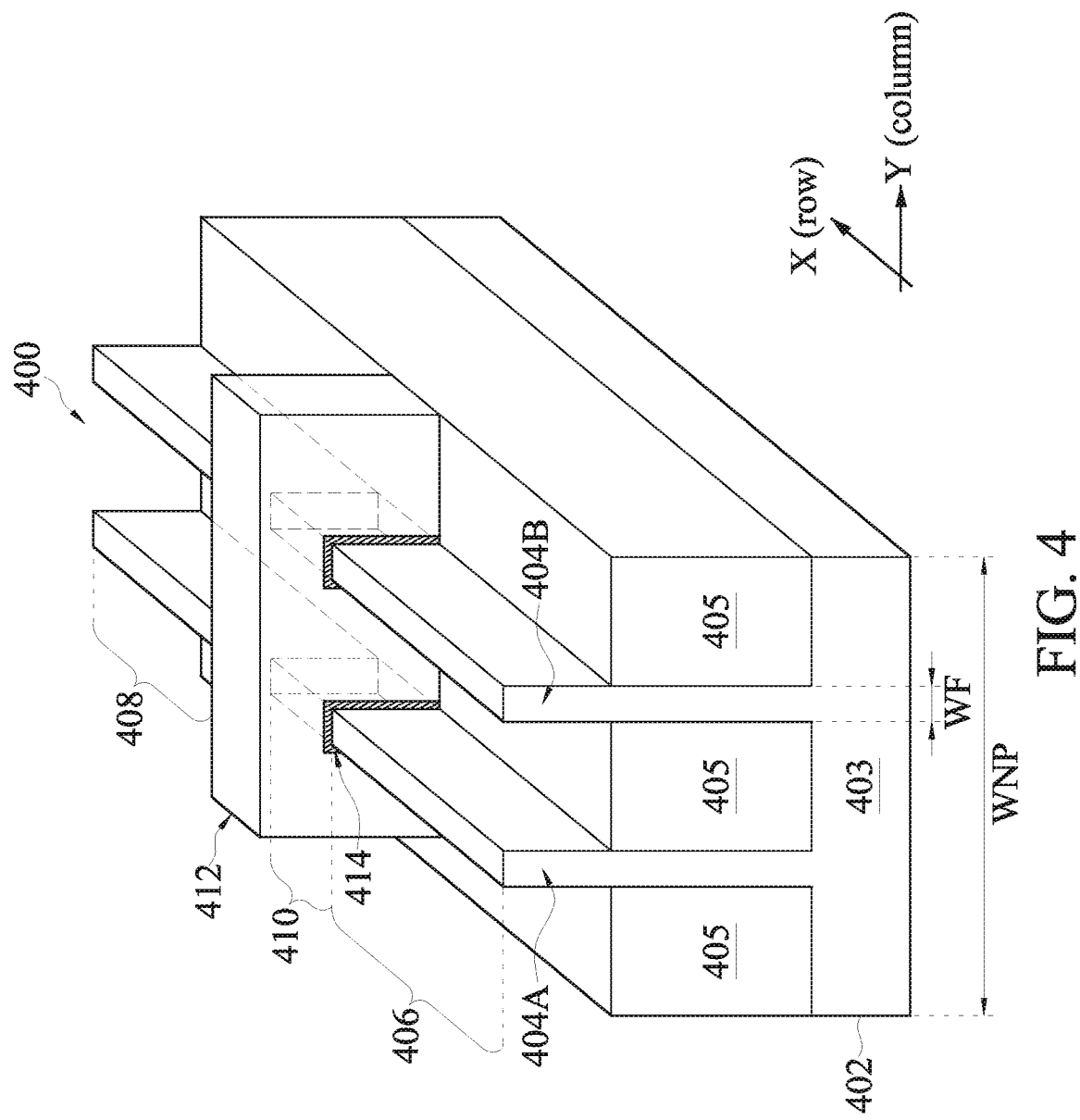
FIG. 4 is a perspective view of a fin field-effect transistor (FinFET) device, in accordance with some embodiments of the present disclosure.

FIG. 4 is a perspective view of a FinFET device 400, according to some embodiments of the present disclosure. In some embodiments, the FinFET device 400 is related to an N-type or P-type active region, such as the active region NOD1, NOD2, NOD3, POD1, POD2 or POD3 in FIG. 3. Referring to FIG. 4, the FinFET device 400 includes a substrate 402, which can be a silicon substrate or other suitable semiconductor substrate. Two exemplary fin structures 404 (e.g., fin structures 404A and 404B), which correspond to fin structures and dummy fin structures in FIG. 3, are formed from and protrude from the substrate 402. The fin structures 404A and 404B are parallel to each other and separated by a trench formed in the substrate 402. In some embodiments, the fin structures 404A and 404B are grown by epitaxy. A lower portion of the fin structure 404A or 404B is embedded in an isolation structure 405 (corresponding to the STI of FIGS. 1 and 3), while an upper portion of the fin structure 404A or 404B is exposed through the surface of the isolation structure 405.

The upper portion of each of the fin structures 404A and 404B includes a source region 406, a drain region 408 and a channel region 410 interposed between the source region 406 and the drain region 408. In some embodiments, the source region 406 and the drain region 408 are formed of doped regions and contain impurities having a dopant concentration in a suitable range, e.g., between about 1E18 cm$^{-3}$ and about 1E×20 cm$^{-3}$. The channel region 410 may be undoped or lightly doped. In some embodiments, the source region 406 and the drain region 408 are formed by etching the upper portions of the fin structure 404 followed by epitaxially growing semiconductor layers over the etched upper portions.

In some embodiments, a doped region 403 is formed in the substrate 402 below the isolation structure 405. In some embodiments, the doped region 403 extends to a lower portion of each of the fin structures 404A and 404B. In some embodiments, the doped region 403 is an N-type or P-type well region that corresponds to the corresponding N-type active region or P-type active region in the planar FET device of FIG. 1. In some embodiments, the doped region includes a dopant concentration in a suitable range, e.g., between about 1E18 cm$^{-3}$ and about 6E18 cm$^{-3}$.

A gate electrode 412, which corresponds to the gate electrodes GT1 through GT4, GT5P and GT5N in FIGS. 1 and 2, is formed over the fin structures 404A and 404B. In some embodiments, the gate electrode 412 is made of one or more layers of conductive materials, such as tungsten, cobalt and copper, and may further include other work function adjusting metals, such as Ti, Al, TiAl, TiN, TaC, and the like. The gate electrode 412 extends to cover sidewalls of the channel region 410 and portions of the isolation structure 405. The FinFET device 400 may also include a gate insulating layer 414 between the gate electrode 412 and the channel region 410. The gate insulating layer 414 may be formed of one or more dielectric materials, such as metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and the like.

Referring to FIG. 3, in the standard cell SC1, two fin structures AF1, which extend in the row direction and are parallel to each other, are arranged in each of the P-type active region POD1 and the N-type active region NOD1. The gate electrode GT1 is provided over the four fin structures AF1 and crosses the isolation structure STI between the P-type active region POD1 and the N-type active region NOD1. Similarly, in the standard cell SC2, two fin structures AF2, which extend in the row direction and are parallel to each other, are arranged in each of the P-type active region POD2 and the N-type active region NOD2. The gate electrode GT2 is provided over the four fin structures AF2 and crosses the isolation structure STI between the P-type active region POD2 and the N-type active region NOD2. In some embodiments, the fin structures AF1 and AF2 serve as active fin structures for forming one or more FinFET CMOS devices. In some embodiments, the fin structures AF1 and AF2 have pitches P1 and P2, respectively.

Two fin structures AFx, which extend in the row direction and are parallel to each other, are arranged in each of the P-type active region PODx and the N-type active region NODx. The gate electrode GTx is provided over the four fin structures AFx and crosses the isolation structure STI between the P-type active region PODx and the N-type active region NODx.

In some embodiments, a dummy fin structure DF1 is disposed at the boundary between the standard cell SC1 and the standard cell SC2 and extends in the row direction. In some embodiments, the dummy fin structure DF1 is separated from the gate electrodes GT1 and GT2. The dummy fin structure DF1 may overlap the upper second power rail V2. Likewise, a dummy fin structure DF2 is disposed at the boundary between the standard cell SC2 and the active region PODx in the row R3, and extends in the row direction. In some embodiments, the dummy fin structure DF2 is separated from the gate electrodes GT2 and GTx. The dummy fin structure DF2 may overlap the lower first power rail V1. In some embodiments, the dummy fin structures DF1 and DF2 are not used for forming FinFET CMOS devices. In some embodiments, the dummy fin structures DF1 and DF2 are electrically isolated from the FET device in the design layout 300. In some embodiments, the dummy fin structure DF1 or DF2 is separated from the adjacent active fin structure AF1, AF2 or AFx by a pitch DP1, DP2 or DPx. The pitches DP1, DP2 and DPx may be equal or different.

In the standard cell SC3, four fin structures AF3N extend in the row direction and are arranged in the N-type active region NOD3 below the gate electrode GT3. Similarly, four fin structures AF3P extend in the row direction and are arranged in the P-type active region POD3 below the gate electrode GT3. In some embodiments, the fin structures AF3N and AF3P serve as active fin structures configured to form one or more FinFET devices.

The standard cell SC3 further includes two fin structures AF3D extending in the row direction, in which one is arranged among the group of fin structures AF3N and the other is arranged among the group of fin structures AF3P. The gate electrode GT3 may run across the two fin structures AF3D. In some embodiments, the fin structures AF3D serve as active fin structures for forming one or more FinFET CMOS devices together with the fin structures AF3N and AF3P. In some embodiments, the fin structures AF3D partially or entirely overlap the upper second power rail V2 or the lower first power rail V1. In some embodiments, the dummy fin structure DF1 or DF2 is aligned with one of the fin structures AF3D in the row direction, e.g., the dummy fin structures DF1 and DF2 and their corresponding active fin structures AF3D are aligned with either the center line CL2 of the upper second power rail V2 or the center line CL1 of the lower first power rail V1.

Through the introduction of the additional active fin structures AF3D, the N-type active region NOD3 and the P-type active region POD3 of the standard cell SC3 aids in improving the FinFET device performance, such as improved speed or power, as compared to the FinFET device performance provided by the interconnected N-type active regions NOD1 and NOD2 or by the interconnected P-type active regions POD1 and POD2 of the standard cell SC1 and the standard cell SC2.

In some embodiments, two fin structures AFy and AFz are formed in the P-type active region PODy and the N-type active region NODz, respectively. In some embodiments, the fin structures AFy and AFz are arranged below the gate electrode GTy and GTz, respectively. In some embodiments, the fin structures AFy and AFz serve as active fin structures configured to form one or more FinFET devices or are used as dummy fin structures.

In some embodiments, the numbers of the fin structures in FIG. 3 and their locations in the column direction are predetermined. For example, the fin structures AF1 and AFy arranged in the P-type active region POD1 and PODy, respectively, are aligned with one of virtual lines VL1 and VL2 extending in the row direction, and the fin structures AF1 and AF3N arranged in the N-type active region NOD1, NOD2 and NOD3 are aligned with one of virtual lines VL3, VL4, VL5 and VL6 extending in the row direction. Likewise, the fin structures AF2, AFx and AF3P arranged in the P-type active region POD2, PODx and POD3 are aligned with one of virtual lines VL7, VL8, VL9 and VL10 extending in the row direction. The fin structures AFx and AFz arranged in the N-type active region NODx and NODz are aligned with one of virtual lines VL11 and VL12 extending in the row direction.

In some embodiments, each of the fin structures described above is aligned with one of the virtual lines VL1 through VL12 according to design rules. Accordingly, any two of the fin structures arranged to be aligned with the same virtual line VL1 through VL12 are also aligned with each other in the row direction. For example, the fin structures AF1 in the P-type active region POD1 are aligned with the fin structures AFy in the upper P-type active region PODy in the row direction.

As described above, the P-type active region PODy or the N-type active region NODz can be replaced by the portion SC5P or SC5N, respectively, of the standard cell SC5. One of ordinary skill in the art should understand that the FinFET structures of the P-type active region PODy or the N-type active region NODz can be applied to the portion SC5P or SC5N, respectively, of the standard cell SC5. Similarly, the FinFET structures of the standard cell SC1 is applied to the standard cell SC4. Repeated descriptions thereof are therefore omitted for brevity.

In some embodiments, the definition of an active region and its width in the column direction in the FinFET device as illustrated in FIG. 3 are different from the definition of an active region and its width in the column direction in the planar FET device as illustrated in FIGS. 1 and 2. Referring to FIG. 3 and FIG. 4, a width WNP of the well region 403 in the column direction corresponds to the width WN1, WP1, WN2 or WP2 of the respective active regions in the column direction. Further, FIG. 4 shows a width WF of each of the fin structures 404A and 404B in the column direction. As described above, the width of a certain active region in the column direction, such as the N-type active regions NOD1 and NOD2 or the P-type active regions POD1 and POD2, is associated with the number of active fin structures arranged therewithin. In some embodiments of the FinFET device, an N-type or P-type active region is a region having a shape of a polygon including the active fin structures, and a nominal width of this active region in the column direction is equal to a width of its corresponding active region in the column direction for a planar FET device, in which the nominal width may be based in part on the portion of the isolation structures STI between the active fin structures. Alternatively, an effective width of this active region in the column direction is determined according to a width sum of the active fin structures formed within the respective active region, and the widths of isolation structures STI between the active fin structures are not taken into consideration. For example, in some embodiments, an effective width WN1 of the N-type active region NOD1 in the standard cell SC1 is the width sum of the two fin structures AF1 in the column direction. In embodiments where the fin structures AF1 have substantially equal widths WF, the effective width WN1 of the N-type active region NOD1 in the column direction is 2×WF. As such, a width of an N-type or P-type active region containing fin structures is alternatively defined as the width sum of the active fin structures within the respective active region, or defined as the number of fin structures within the respective active region multiplied by the width of one fin structure given the assumption of equal widths among the fin structures.

As described above, the nominal width and the effective width of an active region in a planar FET device have the same definition and thus are equal. In some embodiments, the nominal width of an active region including multiple consecutive active fin structures is defined herein as a distance between an upper side of an uppermost active fin structure and a lower side of a lowermost active fin structure among these active fin structures. The use of a nominal width in the FinFET devices provides a convenient way of comparing the area consumption of the so-called active region of the fin-type FET device to that of its planar-type counterpart. Further, in some embodiments, the size comparison of two active regions (equivalently the effective width) including fin structures can be translated to the comparing of the nominal widths of the respective active regions given equal fin pitches between the two active regions. Throughout the present disclosure, both the nominal width and effective width can be used to describe a width of an active region, and thus are referred to by the same label. For example, the nominal width and the effective width of the N-type active region of the first standard cell SC1 are referred to by the label "WN1."

Referring to FIG. 3, in some embodiments, the width sum, expressed by WN1+WN2, of the combined N-type active regions NOD1 and NOD2 of the standard cells SC1 and SC2 is four times the width WF of one fin structure, i.e., 4×WF, assuming the fin structures AF1 and AF2 have substantially equal widths WF in the column direction. In contrast, the effective width WN3 of the N-type active region NOD3 is five times the width WF of one fin structure, i.e., 5×WF, given the assumption that the fin structures AF3N and AF3D in the N-type active region NOD3 have the fin width WF. In some embodiments, the number of active fin structures AF3N and AF3D in the N-type active region NOD3 is greater than twice the number of the active fin structures AF1 in the N-type active region NOD1 or greater than twice the number of the active fin structures AF2 in the N-type active region NOD2. In some other embodiments, if more than one row of the fin structures AF3D is allowed between the group of fin structures AF3N and the group of fin structures AF3P by, e.g., adjusting the pitch DP1 or DP2, the effective width WN3 of the active region NOD3 in the column direction is increased by the widths of these additional fin structures AF3D.

Figure 5:
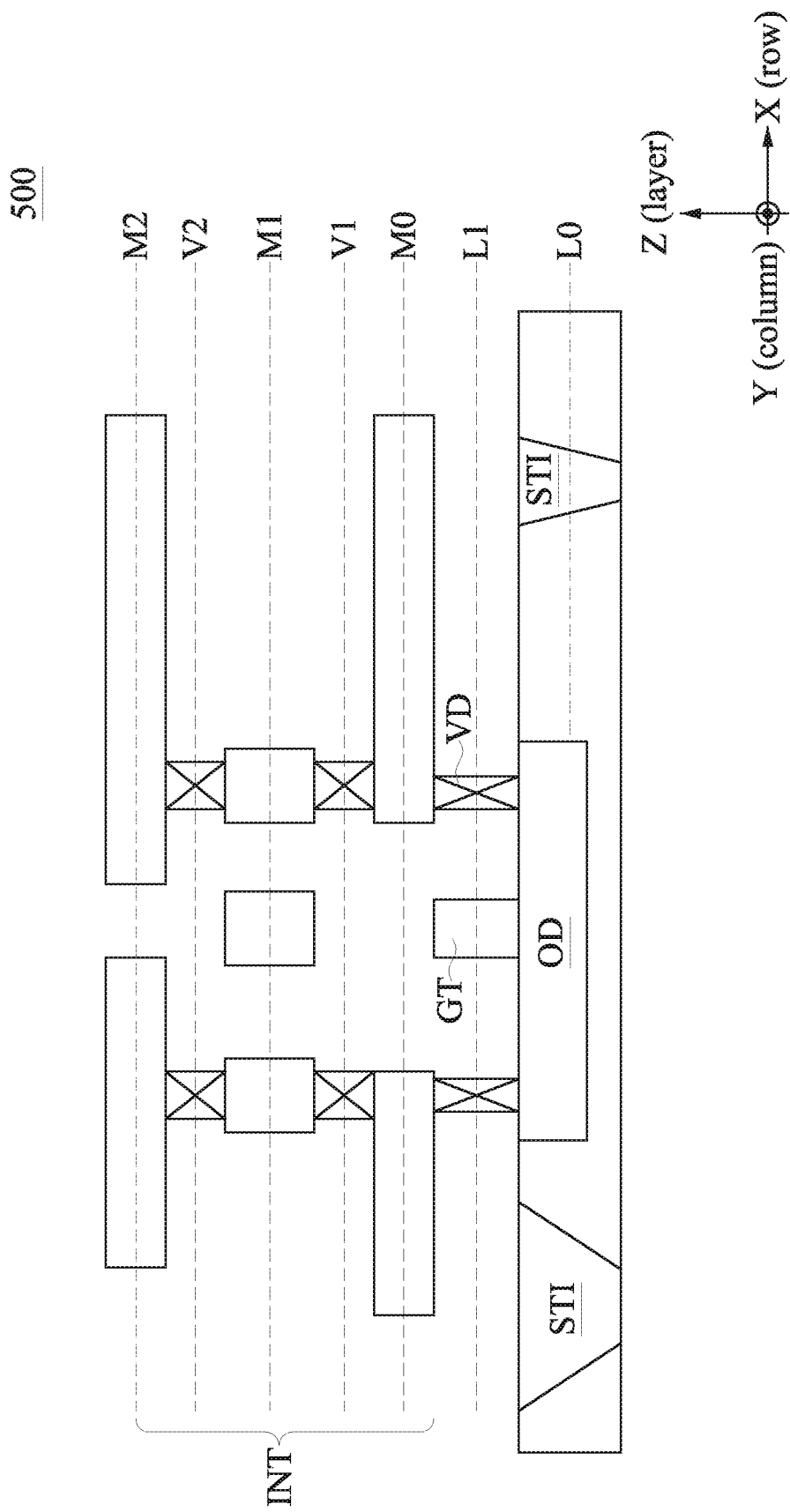
FIG. 5 is a cross-sectional view showing a vertical layer arrangement of a semiconductor device, in accordance with some embodiments of the present disclosure.

FIG. 5 is a cross-sectional view 500 showing a vertical layer arrangement of the semiconductor device in FIGS. 1 to 3, in accordance with some embodiments of the present disclosure.

In some embodiments, an active region OD, which corresponds to the N-type active region (e.g., NOD1, NOD2 and NOD3) or the P-type active region (e.g., POD1, POD2 and POD3) of FIGS. 1 to 3, and isolation structures STI are formed in the substrate layer L0. A gate structure including a gate electrode GT, e.g., gate structures GT1 through GT4 in FIGS. 1 to 3, and a gate insulating layer (not separately shown) are formed in a gate layer L1 over the substrate layer L0. In some embodiments, fin structures, e.g., fin structures AF1, AF2, AF3P and AF3N, and the dummy fins DF1 and AF2 in FIG. 3, are formed in the gate layer or the substrate layer.

In some embodiments, contact vias VD are formed in the gate layer L1 to be electrically coupled to a source region or a drain region in the active region OD. An interconnect structure INT is formed over the gate layer L1 to electrically interconnect the features in the gate layer L1 and the substrate layer L0, or couple the gate layer L1 and the substrate layer L0 to overlying layers. The interconnect structure INT may comprise multiple metal line layers Mx (where x denotes the layer index) and multiple metal via layers Vx (where x denotes the layer index) alternatingly arranged with the metal line layers Mx. Each metal line layer Mx includes one or more metal lines and each metal via layer Vx includes one or more metal vias. One metal line in a metal line layer Mx is electrically coupled to another metal line in the metal line layer M(x+1) through a corresponding metal via in a metal via layer V(x+1) between the metal line layers Mx and M(x+1). The metal line layers Mx and the metal via layers Vx are made of metal, such as copper, aluminum, tungsten, titanium, tantalum, an alloy thereof or the like, and are electrically insulated by dielectric materials (not separately shown) such as oxide, nitride, oxynitride and the like. The number of metal line layers Mx and metal via layers Vx are determined according to application requirements, and the configuration of the interconnect structure INT illustrated in FIG. 5 is not intended to be limiting.

In some embodiments, the metal lines in the metal line layers M0 and M2 extend along the x-axis, i.e., the row direction in FIGS. 1 and 2. In some embodiments, the metal lines in the metal line layers M1 extend along the y-axis, i.e., the column direction in FIGS. 1 and 2. In the depicted embodiment, the power rails V1 and V2 are formed by metal lines in the metal line layer M2. However, in other embodiments, the power rails V1 and V2 can be formed in another metal line layer.

Figure 6:
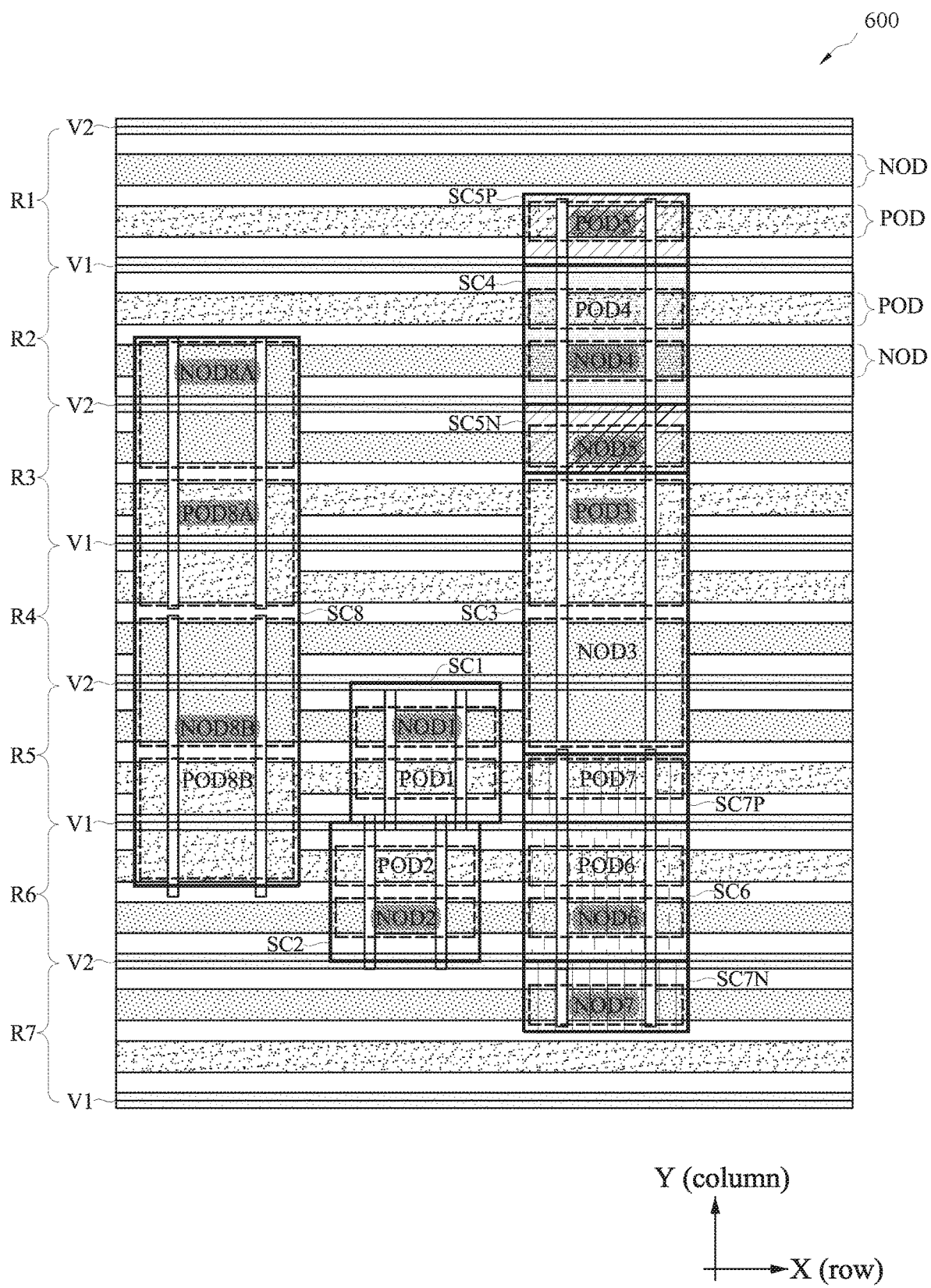
FIG. 6 is a schematic diagram of a design layout, in accordance with some embodiments of the present disclosure.

FIG. 6 is a schematic diagram of a design layout 600, in accordance with some embodiments of the present disclosure. The design layout 600 may be related to or part of a semiconductor device, e.g., a CMOS device, and can be implemented as a planar FET device, a FinFET device, a GAA device, a nanowire device, an FDSOI device, or the like.

Referring to FIG. 6, the design layout 600 includes seven rows R1 through R7 extending in the row direction. A plurality of first power rails V1 for supplying the first voltage and a plurality of second power rails V2 for supplying the second voltage are alternatingly arranged and extend in the row direction. Each of the first power rails V1 and the second power rails V2 is arranged on an upper side or a lower side of one of the rows R1 through R7. In some embodiments, the center line of each of the first power rails V1 and the second power rails V2 is aligned with the upper side or lower side of one of the rows R1 through R7.

Each of the rows R1 through R7 includes a pair of active regions NOD and POD having opposite conductivity types and extending in the row direction. In a configuration similar to those of the design layouts 100, 200 and 300, the orders of the active regions NOD and POD in adjacent rows are interchanged row by row in the design layout 600. For example, two adjacent N-type active regions NOD in the rows R2 and R3 are arranged between the two P-type active regions POD in the rows R2 and R3. Likewise, two adjacent P-type active regions POD in the rows R3 and R4 are arranged between the two N-type active regions NOD in the rows R3 and R4.

The design layout 600 further includes standard cells SC1 through SC8. In some embodiments, the configurations, materials and layout of the standard cells SC1 through SC5 of the design layout 600 are similar to those shown in FIGS. 1 to 3. Each standard cell SC1 through SC8 may have the same or different cell lengths in the row direction. The sizes of the standard cells SC1 through SC8 are defined by their respective cell boundaries, in which each cell boundary includes an upper cell side and a lower cell side (both extending in the row direction) and a left cell side and a right cell side (both extending in the column direction). The standard cells SC1 through SC8 may be separated from one another or share at least one cell side. In the depicted embodiments, two gate electrodes are provided for each standard cell SC1 through S8 and extend in the column direction.

The standard cells SC1, SC2, SC4 and SC6 are first-type standard cells and arranged in the rows R5, R6, R2 and R6, respectively. Each of the first-type standard cells SC1, SC2, SC4 and SC6 has a cell height equal to one row height and includes a P-type active region PODn and an N-type active region NODn, where n=1, 2, 4 and 6, in which the order of the two active regions PODn and NODn may be different in different standard cells.

The standard cell SC3 is a second-type standard cell and arranged in the rows R3 to R5. The second-type standard cell SC3 has a cell height equal to substantially two row heights given that the rows R3 to R5 have equal row heights. The second-type standard cell SC3 includes a glued P-type active region POD3 and a glued N-type active region NOD3. In some embodiments, the orders of the two active regions POD3 and NOD3 in the standard cell SC3 may be exchanged.

The standard cells SC5 and SC7 are third-type standard cells, in which the standard cell SC5 includes portions SC5P and SC5N distributed in the rows R1 and R3, respectively, and the standard cell SC7 includes portions SC7P and SC7N distributed in the rows R5 and R7, respectively.

The standard cell SC8 spans rows R2 through R6. The standard cell SC8 can be deemed as a variant of the second-type standard cell since it includes two glued N-type active regions NOD8A and POD8A having widths greater than the combined widths of two standalone active regions and extending in the rows R2 and R3 and the rows R4 and R5, respectively. The standard cell SC8 further includes two glued P-type active regions NOD8B and POD8B having widths in the column direction greater than the combined widths of the two non-glued active regions and extending in the rows R3 and R4 and the rows R5 and R6, respectively.

Although not separately shown, in some embodiments, the standard cell SC8 can be alternatively formed in any four consecutive rows and the order of the active regions may be exchanged, e.g., a glued P-type active region is arranged at the top of the standard cell, and a glued N-type active region is arranged at the bottom of the standard cell.

The rows R1 through R7 may have the same or different row heights. In embodiments incorporating fin structures, the number of fin structures within the N-type active region NOD of a certain row may be the same as or different from the number of fin structures within the P-type active region POD of the same row. In some embodiments, the non-glued P-type active regions, e.g., POD2 and POD6, which are arranged in a same row R6 and are not used in forming a glued active region, have substantially equal widths or equal numbers of fin structures in the column direction since both of them are defined according to the same active region POD of the row R6. Further, the fin structures in the P-type active region POD2 in the column direction are aligned with the fin structures in the P-type active region POD6.

Similarly, the non-glued N-type active regions, e.g., NOD2 and NOD6, which are arranged in a same row R6 and are not used in forming a glued active region, have substantially equal widths or equal numbers of fin structures in the column direction. Further, the fin structures in the N-type active region NOD2 in the column direction are aligned with the fin structures in the N-type active region NOD6.

In some embodiments, since the glued P-type active region POD8B has an upper portion defined according to the P-type active region POD of the row R5 in a configuration similar to the standalone P-type active regions POD1 and POD7, the fin structures of the glued P-type active region POD8B that fall within the P-type active region POD of the row R5 are aligned with the corresponding fin structures of the standalone P-type active regions POD1 and POD7 in the row direction. Similarly, the fin structures of the glued N-type active region NOD8B that fall within the N-type active region NOD of the row R5 are aligned with the corresponding fin structures of the N-type active region NOD1.

In some embodiments, each of the glued active regions POD8A, POD8B, NOD8A and NOD8D crosses either one of the first power rail V1s or one of the second power rails V2. In some embodiments, the glued P-type active region or N-type active region of a second-type standard cell is symmetric with respect to the first or second power rail V1 or V2 that crosses this glued active region. For example, the N-type active region NOD3 or NOD8B is symmetric with respect to the second power rail V2 between the rows R4 and R5, and the P-type active region POD3 or POD8A is symmetric with respect to the first power rail V1 between the rows R3 and R4.

Figure 7:
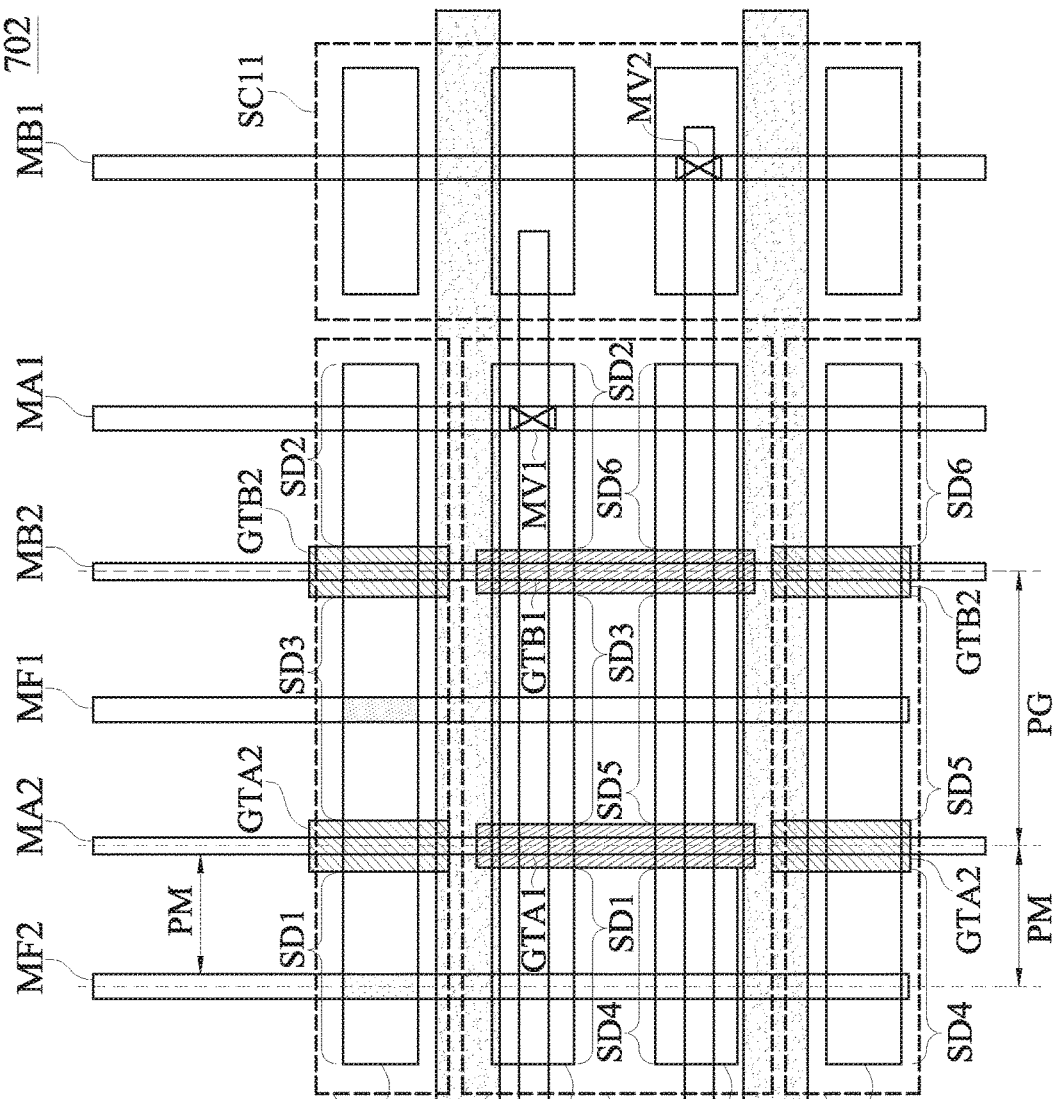
FIG. 7 shows a circuit diagram and a design layout of standard cells, in accordance with some embodiments of the present disclosure.
Figure 7:
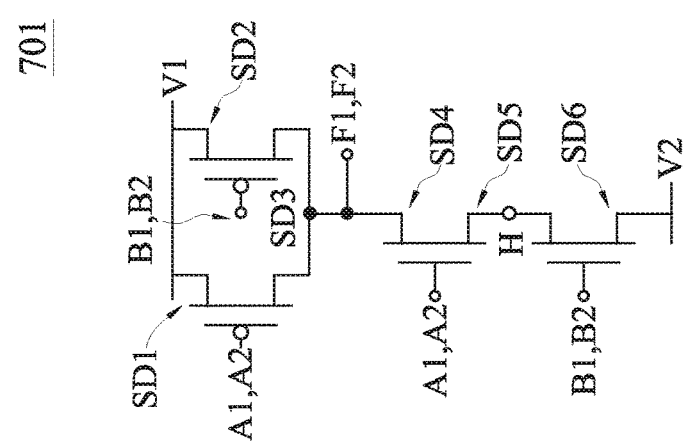

FIG. 7 shows a circuit diagram 701 and a design layout 702 of the standard cells SC9 and SC10, in accordance with some embodiments of the present disclosure. In the depicted embodiments, each of the standard cells SC9 and SC10 is used for implementing a two-input NAND gate. The circuit diagram 701 and the design layout 702 for implementing the NAND gate are illustrated at the left side and right side, respectively, of FIG. 7.

The standard cell SC9 is a first-type standard cell and the standard cell SC10 is a third-type standard cell. The layouts and configurations of the standard cells SC9 and SC10 are similar to those of standard cells SC4 and SC5 in FIG. 1, except that the locations of the N-type active regions and P-type active regions in the standard cell SC9 and SC10 are interchanged in FIG. 7. A first power rail V1 and a second power rail V2 are arranged at an upper side and a lower side of the standard cell SC9. In addition, two gate electrodes GTA1 and GTB1 are provided for the standard cell SC9. Two gate electrodes GTA2 and GTB2 are provided for the standard cell SC10, in which each of the gate electrodes GTA2 and GTB2 includes upper and lower gate electrode portions in the respective portions SC10P and SC10N separated by the standard cell SC9.

In the standard cell SC9, the P-type active region POD9 and the gate electrode GTA1 define source/drain regions SD1 and SD3 in the P-type active region POD9, the P-type active region POD9 and the gate electrode GTB1 define source/drain regions SD3 and SD2 in the P-type active region POD9, the N-type active region NOD9 and the gate electrode GTA1 define source/drain regions SD4 and SD5, and the N-type active region NOD9 and the gate electrode GTB1 define source/drain regions SD5 and SD6.

In the standard cell SC10, the P-type active region POD10 and the upper gate electrode GTA2 define source/drain regions SD1 and SD3 in the P-type active region POD10, the P-type active region POD10 and the upper gate electrode GTB2 define source/drain regions SD3 and SD2 in the P-type active region POD10, the N-type active region NOD10 and the lower gate electrode GTA2 define source/drain regions SD4 and SD5, and the N-type active region NOD10 and the lower gate electrode GTB2 define source/drain regions SD5 and SD6.

The circuit diagram 701 and the design layout 702 show a first input port A1 connected to the electrode gate GTA1, a second input port B1 connected to the electrode gate GTB1, and an output port F1 connected to the source/drain SD3 in the P-type active region POD9, all of the standard cell SC9. Likewise, a first input port A2 is connected to the electrode gate GTA2, a second input port B2 is connected to the electrode gate GTB2, and an output port F2 is connected to the source/drain region SD4 of the N-type active region NOD10, all of the standard cell SC10.

The first power rail V1 and the second power rail V2 are provided in a row direction in the meta line layer M2. The first power rail V1 is electrically coupled to the source/drain regions SD1 and SD2 of the active regions POD9 and POD10. The second power rail V2 is electrically coupled to the source/drain regions SD6 of the active regions NOD5 and NOD10.

Referring to FIG. 5 and FIG. 7, in some embodiments, several metal lines are provided to be electrically coupled to the abovementioned input/output ports. For example, metal lines MG1 and MG2 extending in the row direction are provided in the metal line layer M0 to electrically couple the gate electrodes GTA1 and GTB1, respectively, to overlying features. Some metal vias illustrated in FIG. 5 for electrically connecting the metal line MG1 or MG2 to the electrode gate GTA1 or GTB1 may be omitted in FIG. 7 for brevity.

Metal lines MA2, MB2, MF1 and MF2 are provided in the column direction in the metal line layer M1 and electrically coupled to the gate electrodes GTA2 and GTB2, the source/drain region SD3 of the P-type active region POD9, and the source/drain region SD4 of the N-type active region NOD10, respectively. Further, metal lines MA1 and MB1 are provided in the column direction in the metal line layer M1 and electrically coupled to the metal lines MG1 and MG2, respectively, through metal vias MV1 and MV2 provided in the metal via layer V1. Some metal vias used for electrically connecting the metal lines MA2, MB2, MF1 and MF2 to the gate electrodes GTA2 and GTB2, the source/drain region SD3 of the P-type active region POD5 and the source/drain region SD4 of the N-type active region NOD10 may be omitted in FIG. 7 for brevity.

In some embodiments, a pitch PM between the metal lines MA2, MB2, MF1, MF2 and MA1 is greater than about one half of a pitch PG and less than about the pitch PG, wherein the pitch PG is a distance between the gate electrodes GTA1 and GTB1 (or between the gate electrodes GTA2 and GTB2). In some embodiments, the pitch PM is about one half of the pitch PG. If the pitch PM is greater than the pitch PG, more cell areas may be required and the standard cell SC9 or SC10 may not function efficiently. If the pitch PM is less than about one half of the pitch PG, some fabrication defects, such as bridging, may occur between such closely-arranged metal lines in the same layer due to manufacturing limitations.

In the depicted example, the metal line MB1 is arranged in the metal line layer M1 and extends outside of the cell boundary of the standard cell SC9 or SC10 in order to fulfill the requirement of the pitch PM of the metal lines. In some other embodiments, at least one of the metal lines MA1, MB1, MA2, MB2, MF1 and MF2, which are disposed on the same metal line layer M1, is arranged outside the cell boundary of the standard cell SC9 or SC10, e.g., in another standard cell SC11. As such, a metal line, e.g., the metal line MG2, provided in the metal line layer M0 different from the metal line layer M1 and electrically coupled to the metal line MB1, extends beyond the cell boundary of the standard cell SC9 or SC10 and is electrically coupled to the metal line MB1 through the metal via MV2 disposed outside of the standard cell SC9 or SC10, e.g., the metal via MV2 overlaps the standard cell SC11.

As described above, the third-type standard cell SC5, SC7 or SC10 is proposed for implementing a NAND gate to thereby increase area utilization of the layout. The third-type standard cell can be also used for implementing other types of logic gates, such as an inverter gate, an XOR gate, an AND gate, a NOR gate, an And-Or-Inverter (AOI) gate, or other suitable logic gate devices. In some other embodiments, the third-type standard cell can be used for implementing a filler cell in which the filler cell has a configuration similar to that of a standard cell, except that its gate electrode is used as a dummy gate electrode. In some embodiments, the third-type standard cell can be used for implementing a tap cell in which a well region and a substrate of the tap cell are electrically coupled to the first voltage and the second voltage, respectively. In some embodiments, the filler cell or the tap cell is not used for forming FET devices.

Figure 8A:
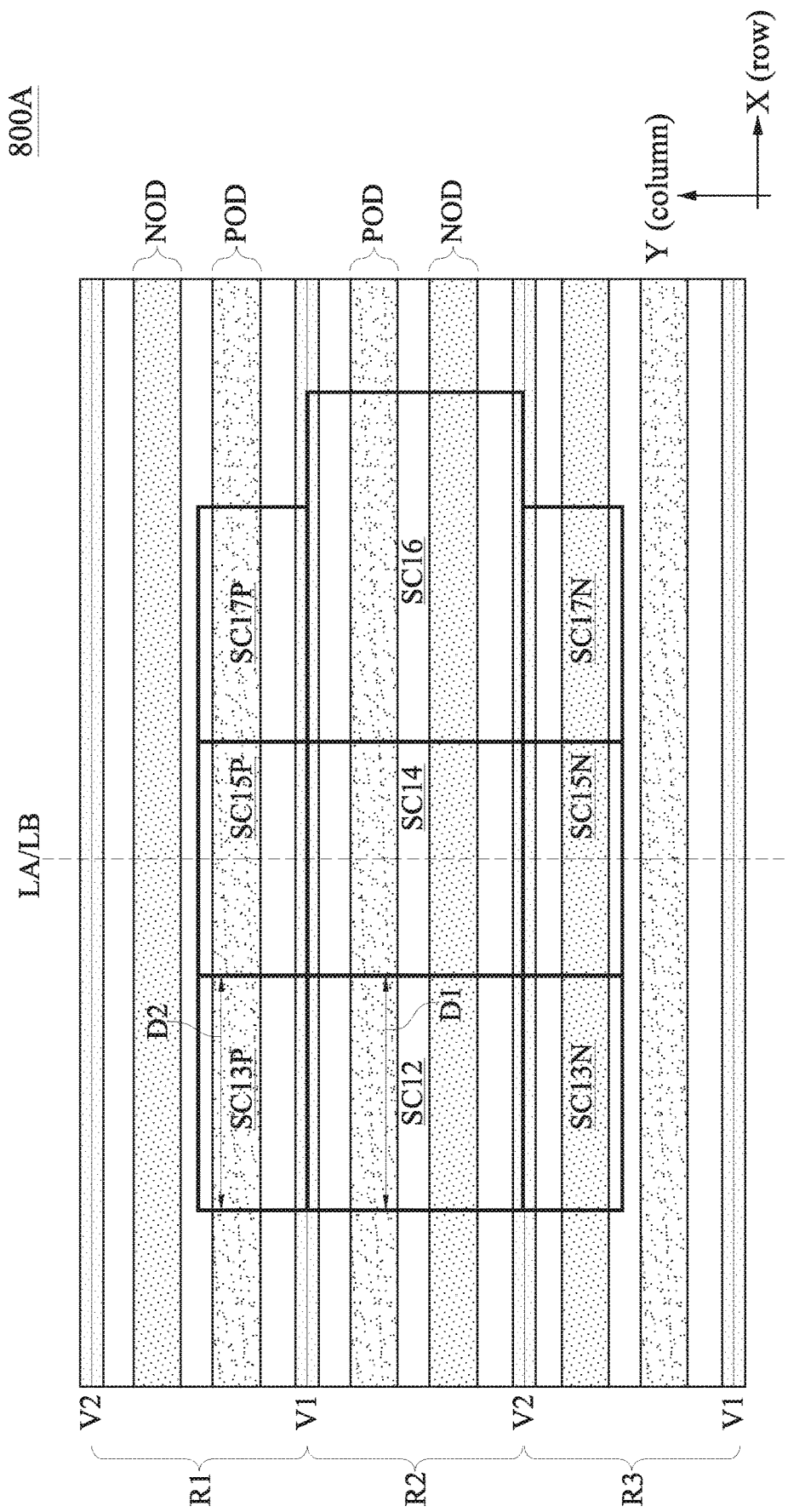
FIGS. 8A to 8C are schematic diagrams of design layouts, in accordance with some embodiments of the present disclosure.
Figure 8B:
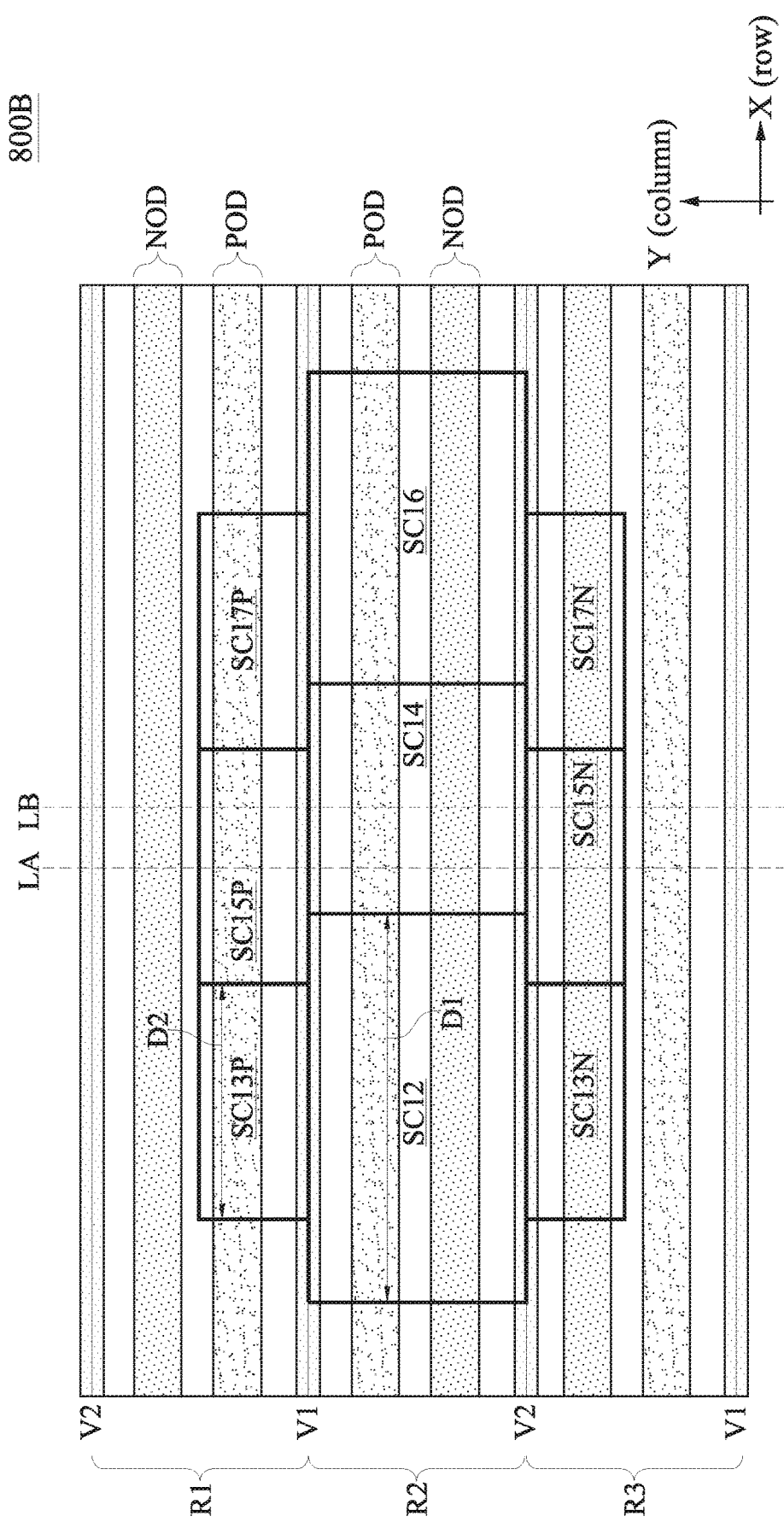
Figure 8C:
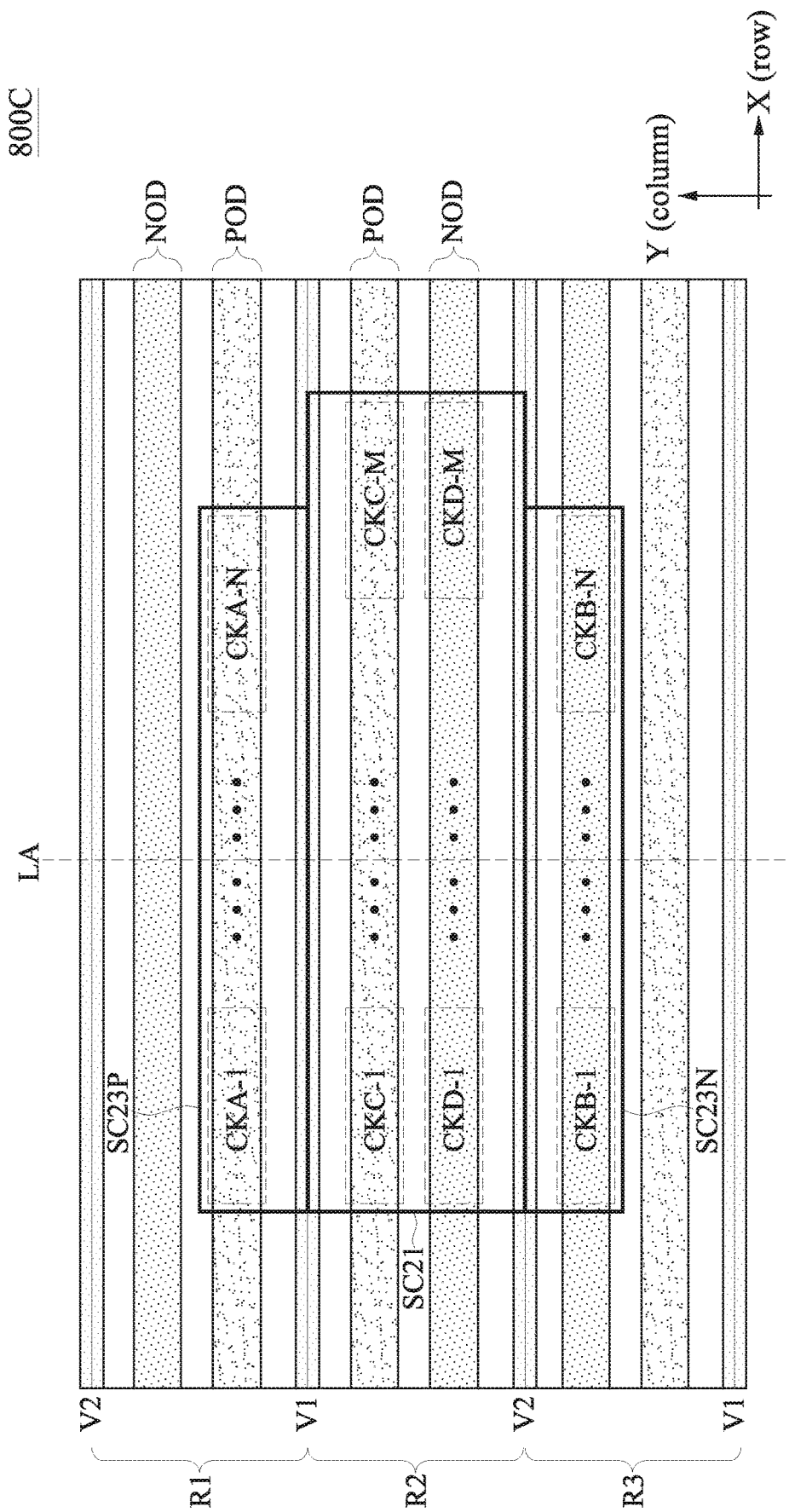

FIGS. 8A to 8C are schematic diagrams of design layouts 800A, 800B and 800C, respectively, in accordance with some embodiments of the present disclosure. The design layout 800A to 800C may be related to or part of a semiconductor device, e.g., a CMOS device, and can be implemented as a planar FET device, a FinFET device, a GAA device, a nanowire device, an FDSOI device, or the like.

Referring to FIGS. 8A and 8B, each of the design layouts 800A and 800B includes first-type standard cells SC12, SC14 and SC16, and third-type standard cells SC13, SC15 and SC17. The first-type standard cells SC12, SC14 and SC16, and the third-type standard cells SC13, SC15 and SC17, are similar to the first-type standard cells and the third-type standard cells described above, and repeated descriptions thereof are omitted for brevity.

FIG. 8A and FIG. 8B illustrate additional configurations of the first-type standard cells and the third-type standard cells. For example, the standard cells SC12, SC14 and SC16 are arranged in a row R2 and in contact with one another, and the standard cells SC13, SC15 and SC17 are arranged in rows R1 and R3 and in contact with one another. The standard cells SC12, SC14 and SC16 may be at least aligned with the standard cells SC13, SC15 and SC17, respectively, in the column direction.

In some embodiments, the standard cell SC12 includes a cell length D1, in the row direction, different from a cell length D2, in the row direction, of the standard cell SC13. In some embodiments as shown in FIG. 8A, the cell length D1 is equal to the cell length D2, while in some other embodiments as shown in FIG. 8B, the cell length D1 may be greater than or less than the cell length D2.

Cell sides of the standard cells SC12, SC14 and SC16 may or may not be flush with the cell sides of the standard cells SC13, SC 15 and SC17. For example, the left cell side of the standard cell SC12 extending in the column direction is flush with the left side of the standard cell SC13 as shown in FIG. 8A, while the left sides of the standard cells SC12 and SC13 are not flush with each other, as shown in FIG. 8B. In some embodiments, a vertical axis LA of the standard cell SC15 in the column direction is parallel to and aligned with a vertical axis LB of the standard cell SC14 in the column direction as shown in FIG. 8A, and the vertical axis LA is parallel to and offset from the vertical axis LB as shown in FIG. 8B.

Referring to FIG. 8C, the design layout 800C includes a first-type standard cell SC21 and a third-type standard cell SC23, in which the standard cell SC23 includes two split portions SC23P and SC23N. The configurations of the first-type standard cell SC21 and the third-type standard cell SC23 are described in the preceding paragraphs, and repeated descriptions thereof are omitted for brevity.

In some embodiments, the standard cell SC 21 includes of one or more electronic circuits CKC-1 through CKC-M (M is a positive integer denoting the number of the electronic circuits) implemented in the P-type active region POD of the row R2, and one or more circuits CKD-1 through CKD-M implemented in the N-type active region NOD of the row R2. In some embodiments, each of the electronic circuits CKC-1 through CKC-M implements one of a NAND gate, an XOR gate, an AND gate, a NOR gate, an AOI gate, and any other suitable logic gate device. The electronic circuits CKC-1 through CKC1-M and CKD-1 through CKD-M are electrically coupled to form a single standard cell SC21 and placed in a design layout (e.g., design layout 800C) during a placement operation. The two circuits CKC-x and CKD-x (x=1-M) may the same or different electronic circuits.

Similarly, the portion SC23P of the standard cell SC 23 includes one or more electronic circuits CKA-1 through CKA-N (N is a positive integer denoting the number of the electronic circuits) implemented in the P-type active region POD of the row R1, and one or more circuits CKB-1 through CKB-N implemented in the N-type active region NOD of the row R3. The integer M may be equal to or different from the integer N. In some embodiments, each of the electronic circuits CKA-1 through CKA-N implements one of a NAND gate, an XOR gate, an AND gate, a NOR gate, an AOI gate, and any other suitable logic gate device. The electronic circuits CKA-1 through CKA1-N and CKB-1 through CKB-N are electrically coupled to form a single standard cell SC23 and placed in a design layout (e.g., design layout 800C) during a placement operation. The two circuits CKA-x and CKB-x (x=1-N) may be the same or different electronic circuits.

Figure 9:
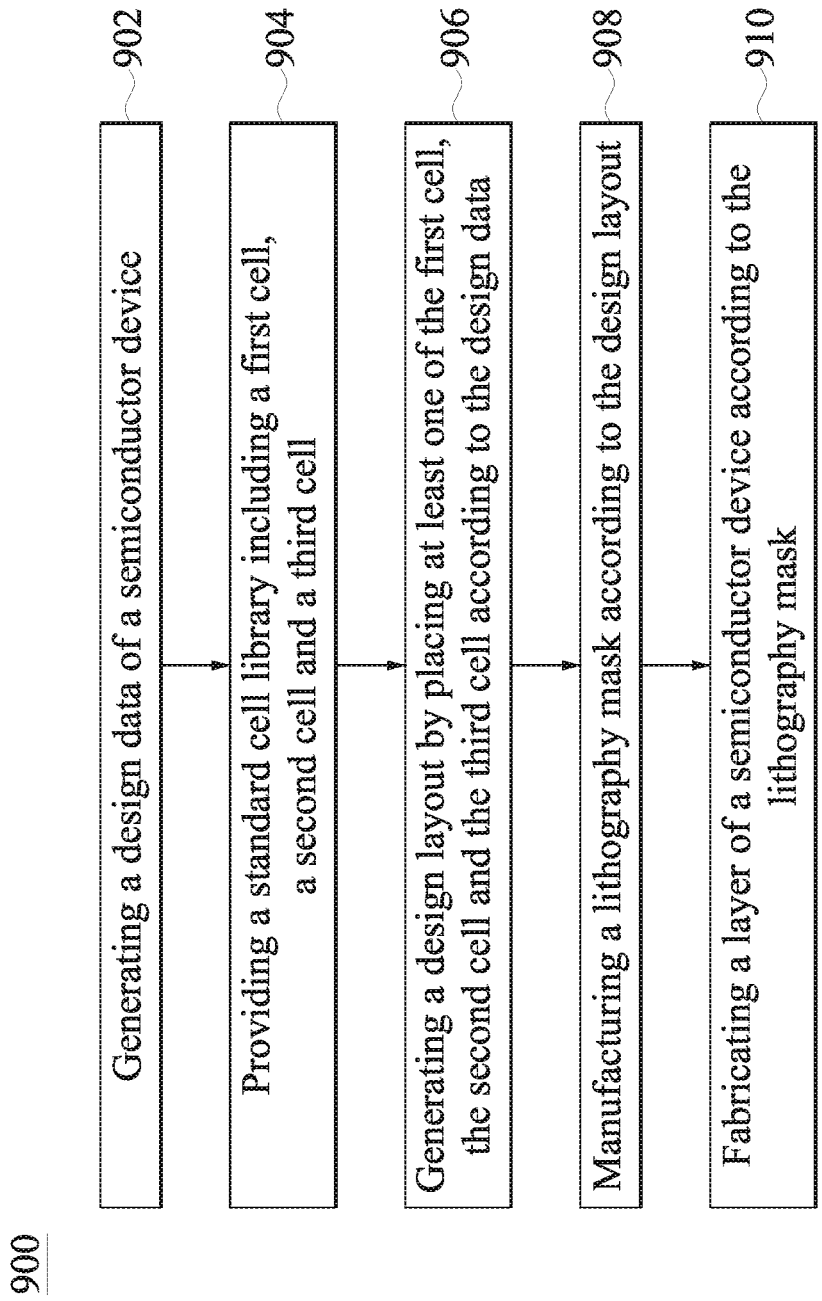
FIG. 9 is a flowchart of a layout method, in accordance with some embodiments.

FIG. 9 is a flowchart of a layout method 900, in accordance with some embodiments. At step 902, a design data of a semiconductor device is generated or received. The design data may be represented as a netlist, a schematic diagram, a circuit diagram or the like. In some embodiments, the semiconductor device includes at least one electronic circuit, which can be a logic gate device in various types, such as a NAND gate, an inverter gate, an XOR gate, an AND gate, a NOR gate, an AOI gate, or other suitable logic gate devices. In some embodiments, the design data in step 902 is generated during a synthesis stage of a design flow for manufacturing the semiconductor device.

At step 904, a standard cell library is provided which includes a first cell, a second cell and a third cell. In some embodiments, the first cell is a first-type cell, the second cell is a second-type cell, and the third cell is a third-type cell. The descriptions of the first-type cell, second-type cell and the third-type cell are discussed previously and are not repeated for brevity.

At step 906, a design layout is generated by at least one of the first cell, the second cell and the third cell according to the design data. The step 906 may be performed during a placement and routing stage of a design flow for manufacturing a semiconductor device.

At step 908, a lithography mask is manufactured according to the design layout. At step 910, a semiconductor device fabricated in which a layer of the semiconductor device is formed according to the lithography mask. In some embodiments, the semiconductor device is fabricated according to the design layout.

Figure 10A:
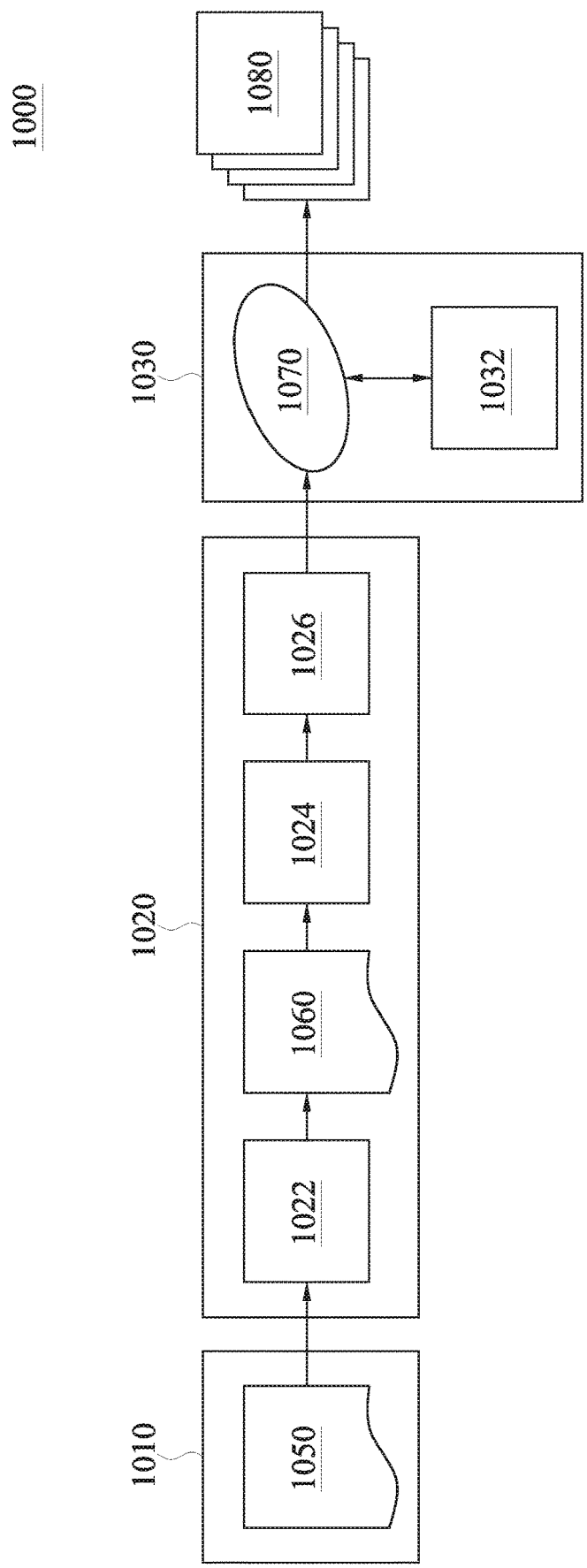
FIG. 10A is a schematic diagram showing an integrated circuit (IC) manufacturing system, in accordance with some embodiments.

FIG. 10A is a schematic diagram 1000 showing an integrated circuit (IC) manufacturing system, in accordance with some embodiments. The IC manufacturing system 1000 is configured to manufacture an IC device 1080 through a plurality of entities, such as a design subsystem 1010, a mask subsystem 1020, and a fabrication subsystem 1030. The entities in the IC manufacturing system 1000 may be linked by a communication channel, e.g., a wired or wireless channel, and interact with one another through a network, e.g., an intranet or the internet. In an embodiment, the design subsystem 1010, the mask subsystem 1020 and the fabrication subsystem 1030 belong to a single entity, or are operated by independent parties.

The design subsystem (design house or layout design provider) 1010 generates a design layout 1050 in a design phase for the IC devices 1080 to be fabricated. The design subsystem 1010 may perform the layout methods discussed in the present disclosure to generate the design layout 1050, e.g., the design layouts shown with reference to the figures of the present disclosure. In an embodiment, the design subsystem 1010 operates a circuit design procedure to generate the design layout 1050. The design subsystem 1010 may include further one or more steps, such as logic design, physical design, pre-layout simulation, placement and routing, timing analysis, parameter extraction, design rule check and post-layout simulation, to generate the design layout 1050. The design layout 1050 may be converted from description texts into their visual equivalents to show a physical layout of the depicted patterns, such as the dimensions, shapes and locations thereof. In an embodiment, the design layout 1050 can be expressed in a suitable file format such as GDSII, DFII, OASIS, or the like.

The mask subsystem 1020 receives the design layout 1050 from the design subsystem 1010 and manufactures one or more masks (photomask, lithography masks or reticles) according to the design layout 1050. In an embodiment, the mask subsystem 1020 includes a mask data preparation block 1022, a mask fabrication block 1024 and a mask inspection block 1026. The mask data preparation block 1022 modifies the design layout 1050 so that a revised design layout 1060 can allow a mask writer to transfer the design layout 1050 to a writer-readable format.

The mask fabrication block 1024 is configured to fabricate the mask by preparing a substrate based on the design layout 1060 provided by the mask data preparation block 1022. A mask substrate is exposed to a radiation beam, such as an electron beam, based on the pattern of the design layout 1060 in a writing operation, which may be followed by an etching operation to leave behind the patterns corresponding to the design layout 1060. In an embodiment, the mask fabrication block 1024 includes a checking procedure to ensure that the layout data 1060 complies with requirements of a mask writer and/or a mask manufacturer to generate the mask as desired. An electron-beam (e-beam), multiple e-beams, an ion beam, a laser beam or other suitable writer source may be used to transfer the patterns.

After the lithography mask is fabricated, the mask inspection block 1026 inspects the fabricated mask to determine if any defects, such as full-height and non-full-height defects, exist in the fabricated mask. If any defects are detected, the mask may be cleaned or the design layout in the mask may be modified.

The fabrication subsystem 1030 is an IC manufacturing entity that includes multiple manufacturing facilities or tools for the fabrication of a variety of the IC devices 1080. The fabrication subsystem 1030 uses the mask fabricated by the mask subsystem 1020 to fabricate a wafer 1070 having a plurality of IC devices 1080 thereon. The wafer 1070 includes a semiconductor substrate and optionally various layers formed thereon. The operations provided by the manufacturing facilities or tools may include, but not limited to, photolithography, deposition, sputtering, etching, diffusion, ion implantation and annealing. In some embodiments, test structures may be formed on the wafer 1070 to generate test data indicative of the quality of the fabricated wafer 1070. In an embodiment, the fabrication subsystem 1030 includes a wafer testing block 1032 configured to ensure that the wafer 1070 conforms to physical manufacturing specifications and mechanical and/or electrical performance specifications. After the wafer 1070 passes the testing procedure performed by the wafer testing block 1032, the wafer 1070 may be diced (or sliced) along the scribe line regions to form separate IC devices 1080. The dicing process can be accomplished by scribing and breaking, by mechanical sawing (e.g., with a dicing saw) or by laser cutting.

Figure 10B:
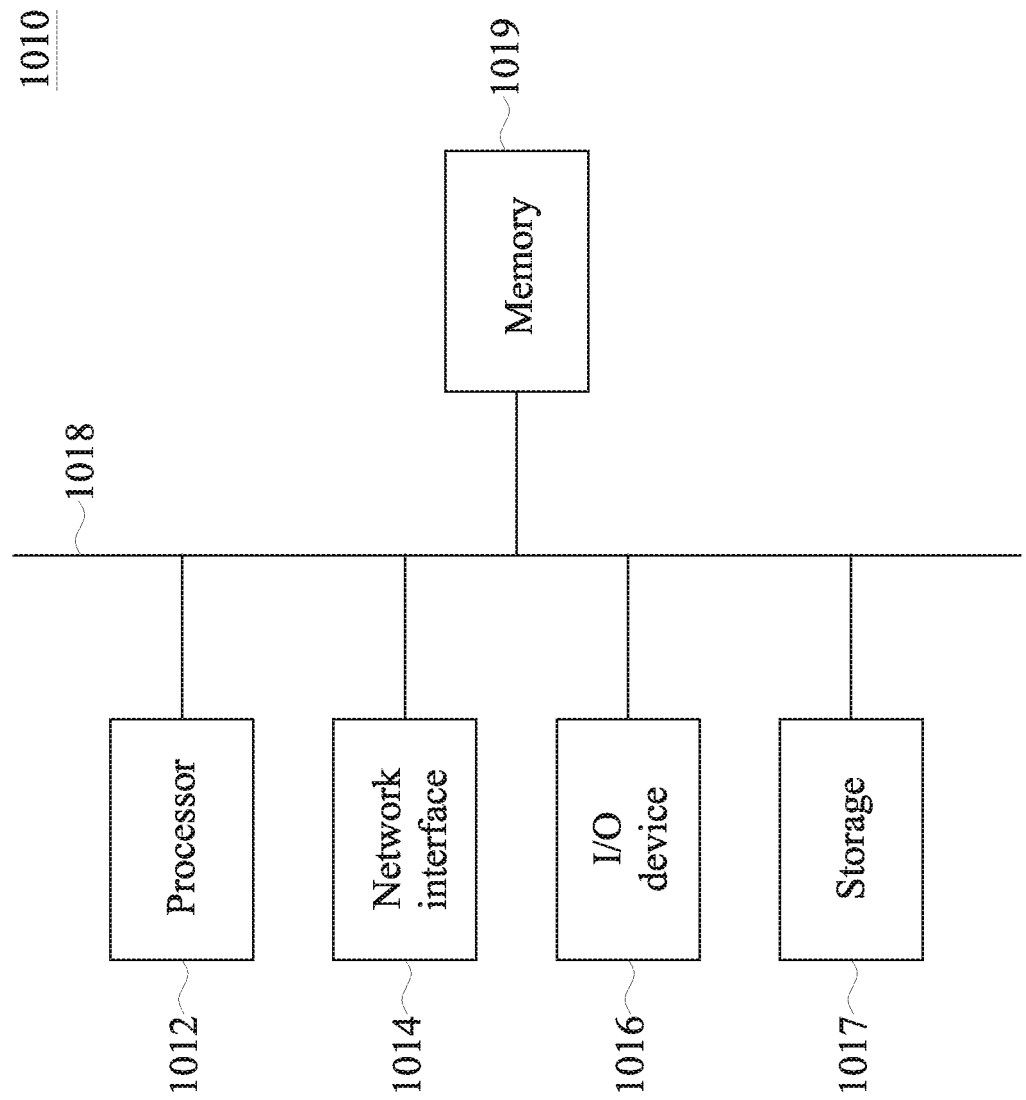
FIG. 10B is a schematic diagram of a design subsystem in the IC manufacturing system shown in FIG. 10A for generating a design layout, in accordance with some embodiments.

FIG. 10B is a schematic diagram of the design subsystem 1010 in the IC manufacturing system 1000 shown in FIG. 10A for generating or storing the design layouts discussed above, in accordance with some embodiments. In some embodiments, the design subsystem 1010 is a computer system. The design subsystem 1010 includes a processor 1012, a network interface 1014, an input and output (I/O) device 1016, a storage device 1017, a memory 1019, and a bus 1018. The bus 1018 couples the network interface 1014, the I/O device 1016, the storage device 1017, the memory 1019 and the processor 1012 to each other.

The processor 1012 is configured to execute program instructions that include a tool configured to generate the design layouts as described and illustrated with reference to figures of the present disclosure.

The network interface 1014 is configured to access program instructions and data accessed by the program instructions stored remotely through a network (not shown).

The I/O device 1016 includes an input device and an output device configured for enabling user interaction with the circuit design subsystem 1010. In some embodiments, the input device includes, for example, a keyboard, a mouse, and other devices. Moreover, the output device includes, for example, a display, a printer, and other devices.

The storage device 1017 is configured for storing the design layouts, program instructions and data accessed by the program instructions. In some embodiments, the storage device 1017 includes a standard cell library for storing the data of the standard cells as discussed in the present disclosure. In some embodiments, the storage device 1017 includes a non-transitory computer-readable storage medium, for example, a magnetic disk and an optical disk.

The memory 1019 is configured to store program instructions to be executed by the processor 1012 and data accessed by the program instructions. In some embodiments, the memory 1019 includes any combination of a random access memory (RAM), some other volatile storage device, a read-only memory (ROM), and some other non-volatile storage device.

According to an embodiment, a semiconductor device includes a first power rail extending in a row direction and configured to supply a first voltage, a second power rail extending in the row direction and configured to supply a second voltage different from the first voltage, and a first cell arranged in a first row between the first and second power rails. The first cell has a first first-type active region and a first second-type active region, and a first cell height of the first cell in a column direction perpendicular to the row direction is defined as a pitch between the first power rail and the second power rail. The semiconductor device further includes a second cell having a second first-type active region and a second second-type active region, wherein the second first-type active region extends in a second row and a third row on a first side of the first row and has a first width in the column direction greater than a second width of the first first-type active region in the column direction. The semiconductor device also includes a third cell including a first portion and a second portion, wherein the first portion and the second portion are arranged on two sides of the first cell.

According to an embodiment, a semiconductor device includes: a first power rail; a second power rail adjacent to and parallel to the first power rail; a first cell arranged in a first row between the first and second power rails, wherein the first cell includes a first first-type active region and a first second-type active region; a second cell including a second first-type active region and a second second-type active region, wherein the second first-type active region extends from a second row on a first side of the first row to a third row and includes a first width in a column direction greater than a second width of the first first-type active region in the column direction; and a third cell including a first portion and a second portion arranged in the second row and a fourth row, respectively, adjacent to the first cell, wherein the second and fourth rows are arranged on opposite sides of the first row.

According to an embodiment, a method of manufacturing a semiconductor device includes: generating a design data of the semiconductor device; providing a standard cell library including a first cell, a second cell and a third cell; and generating a design layout by placing at least one of the first cell, the second cell and the third cell according to the design data. The first cell is arranged in a first row of the design layout, and the first cell includes: a first power rail and a second power rail aligned with an upper side and a lower side, respectively, of the first row, wherein a first cell height of the first cell is defined as a distance between a center line of the first power rail and a center line of the second power rail; and a first first-type active region arranged adjacent to the first power rail and a first second-type active region adjacent to the second power rail. The second cell is arranged in a second row, a third row and a fourth row of the design layout, wherein the second row is adjacent to the first row and the second cell includes: a second first-type active region and a second second-type active region; a third power rail crossing the second first-type active region; and a fourth power rail crossing the second second-type active region. The second first-type active region has a first width in a column direction greater than a second width in the column direction of the first first-type active region. The third cell includes a third first-type active region and a third second-type active region separated from each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first power rail extending in a row direction and configured to supply a first voltage;
   a second power rail extending in the row direction and configured to supply a second voltage different from the first voltage;
   a first cell arranged in a first row between the first and second power rails, wherein the first cell comprises a first first-type active region and a first second-type active region, and a first cell height of the first cell measured in a column direction perpendicular to the row direction is defined as a pitch between the first power rail and the second power rail;

a second cell comprising a second first-type active region and a second second-type active region, wherein the second first-type active region extends in a second row and a third row on a first side of the first row and comprises a first width measured in the column direction greater than a second width of the first first-type active region measured in the column direction; and a third cell comprising a first portion and a second portion, wherein the first portion and the second portion are arranged on two sides of the first cell.

2. The semiconductor device according to claim 1, wherein the second portion comprises a third first-type active region and the first portion comprises a third second-type active region.

3. The semiconductor device according to claim 2, wherein a first distance between the first first-type active region and the third first-type active region is less than a second distance between the first second-type active region and the third first-type active region.

4. The semiconductor device according to claim 1, wherein the third cell is configured as a tap cell or a filler cell.

5. The semiconductor device according to claim 1, wherein the first cell comprises a first length measured in the row direction different from a second length, measured in the row direction, of the third cell.

6. The semiconductor device according to claim 1, wherein a vertical axis of the first cell in the column direction is offset from a vertical axis, in the column direction, of the third cell.

7. The semiconductor device according to claim 1, wherein the first cell further comprises a plurality of gate electrodes extending in the column direction, wherein the semiconductor device further comprises a plurality of first metal lines extending in the column direction and electrically coupled to the first cell and the third cell, and wherein a pitch of the plurality of first metal lines is about one half of a pitch of the gate electrodes.

8. The semiconductor device according to claim 7, further comprising a second metal line extending in the row direction and electrically coupled to at least one of the plurality of first metal lines.

9. The semiconductor device according to claim 8, wherein the second metal line extends outside a boundary of the first cell.

10. The semiconductor device according to claim 1, wherein a height summation of the first portion and the second portion in the column direction is equal to the first cell height.

11. The semiconductor device according to claim 1, wherein the second second-type active region comprises a third width measured in the column direction greater than a fourth length of the first second-type active region measured in the column direction.

12. The semiconductor device according to claim 1, further comprising a third power rail extending in the row direction and configured to supply the first voltage, wherein the third power rail overlaps the second first-type active region.

13. A semiconductor device comprising:
a first power rail extending in a row direction;
a second power rail extending in the row direction;
a first cell arranged in a first row between the first and second power rails, wherein the first cell comprises a first first-type active region and a first second-type active region, and a first cell height of the first cell measured in a column direction perpendicular to the row direction is defined as a pitch between the first power rail and the second power rail;

a second cell comprising a second first-type active region and a second second-type active region, wherein the second first-type active region extends from a second row on a first side of the first row to a third row and comprises a first width measured in the column direction greater than a second width of the first first-type active region measured in the column direction; and a third cell comprising a first portion and a second portion, wherein the first portion and the second portion are arranged on two sides of the first cell.

14. The semiconductor device according to claim 13, further comprising a third power rail arranged between the second row and the third row, wherein the second first-type active region overlaps the third power rail.

15. The semiconductor device according to claim 14, further comprising a fourth power rail on a side of the third row opposite the third power rail, wherein the second second-type active region overlaps the fourth power rail.

16. The semiconductor device according to claim 13, wherein a width, measured in the column direction, of the second first-type active region is greater than twice a width, measured in the column direction, of the first first-type active region.

17. A semiconductor device comprising:
a first power rail configured to supply a first voltage;
a second power rail parallel to the first power rail, and configured to supply a second voltage different from the first voltage;
a first cell arranged in a first row between the first and second power rails, wherein the first cell comprises a first first-type active region and a first second-type active region, and a first cell height of the first cell measured in a column direction is defined as a pitch between the first power rail and the second power rail;
a second cell comprising a second first-type active region and a second second-type active region, wherein the second first-type active region extends from a second row on a first side of the first row to a third row and comprises a first width measured in the column direction greater than a second width of the first first-type active region measured in the column direction; and
a third cell comprising a first portion and a second portion, wherein the first portion and the second portion are arranged on two sides of the first cell.

18. The semiconductor device according to claim 17, wherein the first first-type active region and the first second-type active region have substantially equal widths measured in the column direction.

19. The semiconductor device according to claim 17, further comprising a dummy fin structure extending in a row direction and aligned with the first power rail, wherein the first cell further comprises an active fin structure extending in the row direction and aligned with the dummy fin structure in the row direction.

20. The semiconductor device according to claim 17, wherein the first first-type active region is a P-type active region, and the first second-type active region is an N-type active region.

* * * * *